United States Patent
Liang

(10) Patent No.: US 8,129,257 B2
(45) Date of Patent: Mar. 6, 2012

(54) VERTICAL OUTGASSING CHANNELS

(75) Inventor: Di Liang, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 255 days.

(21) Appl. No.: 12/353,798

(22) Filed: Jan. 14, 2009

(65) Prior Publication Data

US 2009/0194787 A1   Aug. 6, 2009

Related U.S. Application Data

(60) Provisional application No. 61/020,920, filed on Jan. 14, 2008.

(51) Int. Cl.
*H01L 21/30* (2006.01)

(52) U.S. Cl. ........ 438/456; 438/118; 438/406; 438/455; 438/464; 257/E21.088; 257/E21.122; 257/E27.137; 257/E27.144; 257/E27.161

(58) Field of Classification Search ........... 257/E27.137, 257/E27.144, E27.161, E21.088, E21.122, 257/782; 438/406, 455, 464, 118, 456
See application file for complete search history.

(56) References Cited

U.S. PATENT DOCUMENTS 6,455,398 B1 * 9/2002 Fonstad et al. ................ 438/459
(Continued)

OTHER PUBLICATIONS

Bakos, T. et al., "Reactions and diffusion of water and oxygen molecules in amorphous SiO2," Physical Review Letters, vol. 88, No. 5, Feb. 4, 2000, pp. 055508-1-055508-4.

(Continued)

*Primary Examiner* — Benjamin Sandvik
*Assistant Examiner* — Farid Khan
(74) *Attorney, Agent, or Firm* — Gates & Cooper LLP

(57) ABSTRACT

InP epitaxial material is directly bonded onto a Silicon-On-Insulator (SOI) wafer having Vertical Outgassing Channels (VOCs) between the bonding surface and the insulator (buried oxide, or BOX) layer. $H_2O$ and other molecules near the bonding surface migrate to the closest VOC and are quenched in the buried oxide (BOX) layer quickly by combining with bridging oxygen ions and forming pairs of stable nonbridging hydroxyl groups (Si—OH). Various sizes and spacings of channels are envisioned for various devices.

11 Claims, 17 Drawing Sheets

U.S. PATENT DOCUMENTS

| | | | |
|---|---|---|---|
| 6,492,195 | B2 | 12/2002 | Nakanishi et al. |
| 7,148,122 | B2 | 12/2006 | Shaheen et al. |
| 2006/0284247 | A1 | 12/2006 | Augustine et al. |
| 2007/0155056 | A1* | 7/2007 | Kang et al. ............... 438/118 |

OTHER PUBLICATIONS

Chao, Y. et al., "Ammonium hydroxide effect on low-temperature wafer bonding energy enhancement," Electrochemical and Solid-State Letters 8 (3), 2005, pp. G74-G77.

Fang, A. et al., "A continuous-wave hybrid AlGaInAs-silicon evanescent laser," IEEE Photonics Technology Letters, vol. 18, No. 10, May 15, 2006, pp. 1143-1145.

Ghandhi, S., "VLSI fabrication principles: silicon and gallium arsenside," 1st Edition (John Wiley and Sons, New York) 1983, pp. 376-377.

Gosele, U. et al., "Semiconductor wafer bonding," Annu. Rev. Mater. Sci. 28, 1998, pp. 215-241.

Huang, H. et al., "Low temperature InP/Si wafer bonding using boride treated surface," Applied Physics Letters 90, 2007, pp. 161102-1-161102-3.

Irene, E. et al., "A viscous flow model to explain the appearance of high density thermal SiO2 at low oxidation temperatures," J. Electrochem. Soc. 129, Nov. 1982, pp. 2594-2597.

Kim, E. et al., "Silicon direct bonding technology employing a regularly grooved surface," Electronic Letters, vol. 31, No. 23, 9 Nov. 1995, pp. 2047-2048.

Kissinger, G. et al., "Void-free silicon-wafer-bond strengthening in the 200-400 °C range," Sensors and Actuators A 36, 1993, pp. 149-156.

Mack, S. et al., "Analysis of bonding-related gas enclosure in micromachined cavities sealed by silicon wafer bonding," J. Electrochem. Soc., vol. 144, No. 3, Mar. 1997, pp. 1106-1111.

Mack, S. et al., "Gas development at the interface of directly bonded silicon wafers: investigation on silicon-based pressure sensors," Sensors and Actuators A 56, 1996, pp. 273-277.

Maszara, W. et al., "Bonding of silicon wafers for silicon-on-insulator," J. Appl. Phys. 64, 10, Nov. 15, 1988, pp. 4943-4950.

Maszara, W. et al., "Silicon-on-insulator by wafer bonding: a review," J. Electrochem. Soc., vol. 138, No. 1, Jan. 1991, pp. 341-347.

Park, H. et al., "Hybrid silicon evanescent laser fabricated with a silicon waveguide and III-V offset quantum wells," Optics Express, vol. 13, No. 23, Nov. 14, 2005, pp. 9460-9464.

Pasquariello, D. et al., "Plasma-assisted InP-to-Si low temperature wafer bonding," IEEE Journal on Selected Topics in Quantum Electronics, vol. 8, No. 1, Jan./Feb. 2002, pp. 118-131.

Revesz, A., The role of hydrogen in Si02 film on silicon, J. Electrochem. Soc. 126, 1979, pp. 122-130.

Tan, C. et al., "Low-temperature thermal oxide to plasma-enhanced chemical vapor deposition oxide wafer bonding for thin-film transfer application," Applied Physics Letters, vol. 82, No. 16, Apr. 21, 2003, pp. 2649-2651.

Tong, Q. et al., "Low temperature InP/Si wafer bonding," Applied Physics Letters, vol. 84, No. 5, Feb. 2, 2004, pp. 732-734.

Tong, Q. et al., "Room temperature SiO2/SiO2 covalent bonding," Applied Physic Letters 89, 2006, pp. 042110-1-042110-3.

Wallis, G. et al., "Field assisted glass-metal sealing," Journal of Applied Physics, vol. 40, No. 10, Sep. 1969, pp. 3946-3949.

Zhang, X. et al., "Low-temperature wafer bonding: a study of void formation and influence on bonding strength," Journal of Microelectromechanical Systems, vol. 14, No. 2, Apr. 2005, pp. 368-382.

Soitec—Strategic alliances, http://www.soitec.com/en/about/, 2008, one page.

Tong, Q. et al., Semiconductor wafer bonding: science and technology, 1st Ed. (John Wiley & Sons, New York) 1998, pp. 123.

Fang, A. et al., "Hybrid silicon evanescent devices," Materials Today, vol. 10, No. 7-8, Jul.-Aug. 2007, pp. 28-35.

Itsumi, M. et al., SiO2 in Si microdevices, 1st Ed. (Springer Verlag, Berlin), 2003, pp. 3.

Liang, D. et al., "Low-temperature, strong SiO2-SiO2 covalent wafer bonding for III-V compound semiconductors-to-silicon photonic integrated circuits," Journal of Electronic Materials, 2007, 8 pages.

International Search Report, International application No. PCT/US09/30997, International filed Jan. 14, 2009.

Bowers et al., "A technology for integrating active photonic devices on SOI wafers," Proceedings of 2006 International Conference of Indium Phosphide and Related Materials, Jun. 5, 2006, pp. 218-221.

Fang et al., "Electrically pumped hybrid AlGaInAs-silicon evanescent laser," Optics Express, vol. 14, No. 20, Oct. 2, 2006, pp. 9203-9210.

Pasquariello et al., "Plasma-assisted InP-to-Si low temperature wafer bonding," IEEE Journal on Selected Topics Quantum Electronics, Jan./Feb. 2002, vol. 8, No. 1, pp. 118-131.

* cited by examiner ately bonded 2 μm thick InP epitaxial layer attached on the
VERTICAL OUTGASSING CHANNELS

CROSS-REFERENCE TO RELATED APPLICATIONS

This application claims the benefit under 35 U.S.C. §119 (e) of U.S. Application Ser. No. 61/020,920, filed on Jan. 14, 2008, by Di Liang, entitled "VERTICAL OUTGASSING CHANNELS," which application is incorporated by reference herein.

STATEMENT REGARDING FEDERALLY SPONSORED RESEARCH OR DEVELOPMENT

This invention was made with Government support under Grant No. W911NF-06-1-0496 awarded by the U.S. Army. The Government has certain rights in this invention.

BACKGROUND OF THE INVENTION

Description of the Related Art (Note: This application references a number of different publications as indicated throughout the specification by one or more reference numbers within brackets, e.g., [Ref(s). x] or in superscript form. A list of these different publications ordered according to these reference numbers can be found below in the section entitled "References." Each of these publications is incorporated by reference herein.)

Low-temperature direct wafer bonding is favored for dissimilar materials integration, particularly in III-V compound semiconductors-to-silicon integration for attraction from desirable functionalities of direct-bandgap materials and standard low-cost CMOS manufacturing technologies.

BRIEF DESCRIPTION OF THE DRAWINGS

Referring now to the drawings in which like reference numbers represent corresponding parts throughout:

FIG. 10 illustrates Nomaski-mode microscopic images of a InP-SOI bonded pair after 300° C. anneal for 30 minutes, showing noticeable contrast between (a) VOC region (S=50 μm) and non-VOC corner, and (b) VOC regions (S=50 μm and 100 μm) with a 1 mm wide non-VOC margin in between.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Low-temperature direct wafer bonding is favored for dissimilar materials integration, particularly in III-V compound semiconductors-to-silicon integration for attraction from desirable functionalities of direct-bandgap materials and standard low-cost CMOS manufacturing technologies. Unlike mature silicon-to-silicon or $SiO_2$ bonding techniques, however, low-temperature anneal (<400° C.) in compound semiconductor-to-silicon bonding is rigorously required to minimize thermal expansion mismatch-induced stress and potential thermal material degradation. Interfacial voids are likely to form at the bonding interface due to lack of high anneal temperature to drive gas byproducts ($H_2O$ vapor mostly and some $H_2$, $N_2$ and $CO_2$) out of the bonding interface effectively.

The present invention demonstrates an efficient approach to achieve void-free, low-temperature direct wafer bonding on the non-amorphous material-on-amorphous material substrate, e.g., silicon-on-insulator (SOI), by employing a vertical outgassing channel (VOC) design.

Vertical Outgassing Channels

Figure 1:
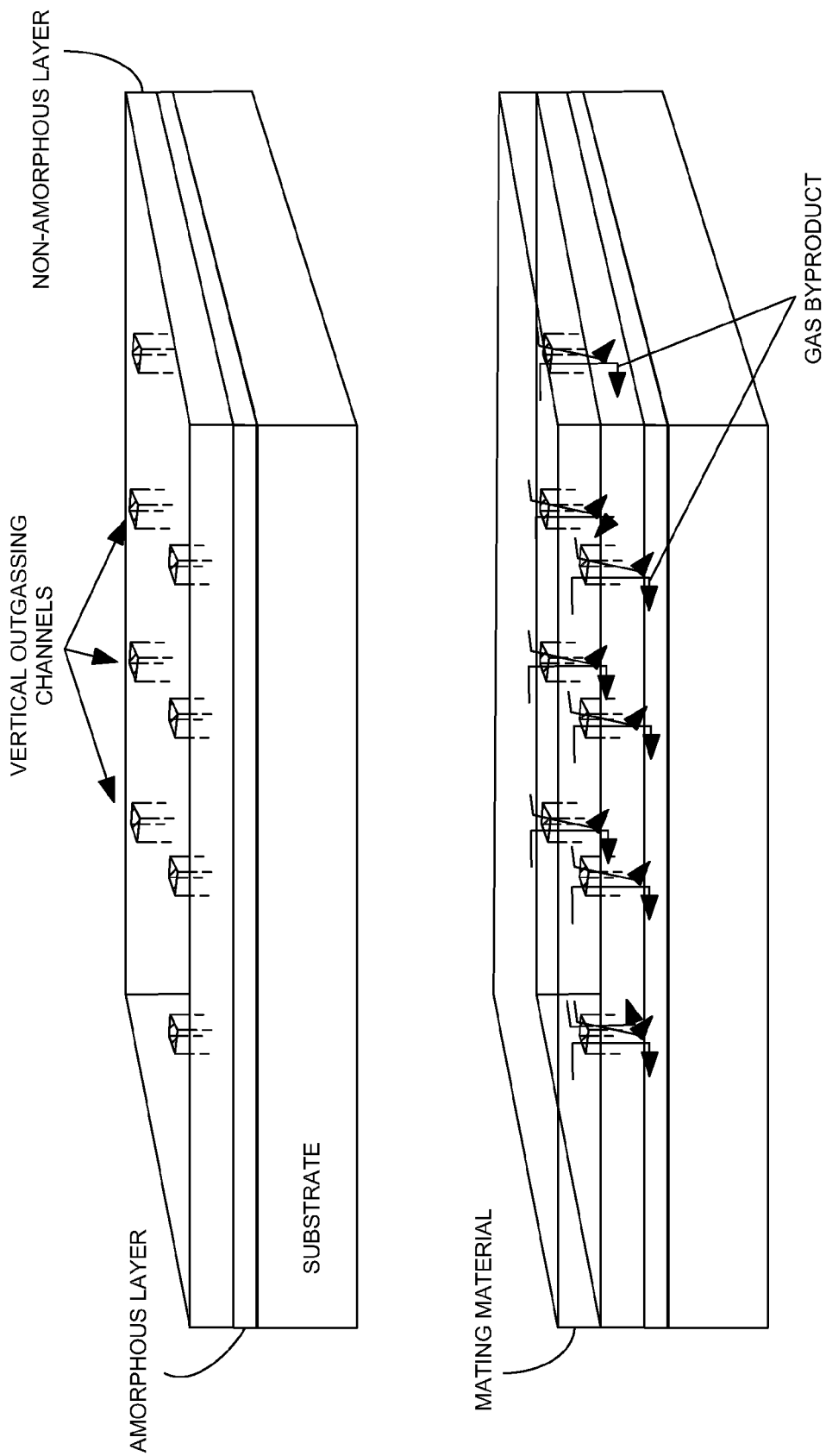
FIG. 1 illustrates the schematic of VOCs through the top non-amorphous material layer to lead gas byproducts diffusing into the underneath amorphous layer for efficient outgassing.

FIG. 1 shows the schematic of VOCs which are essentially holes through the top non-amorphous material layer to lead gas byproducts diffusing into the underneath amorphous layer for efficient outgassing.

Figure 2:
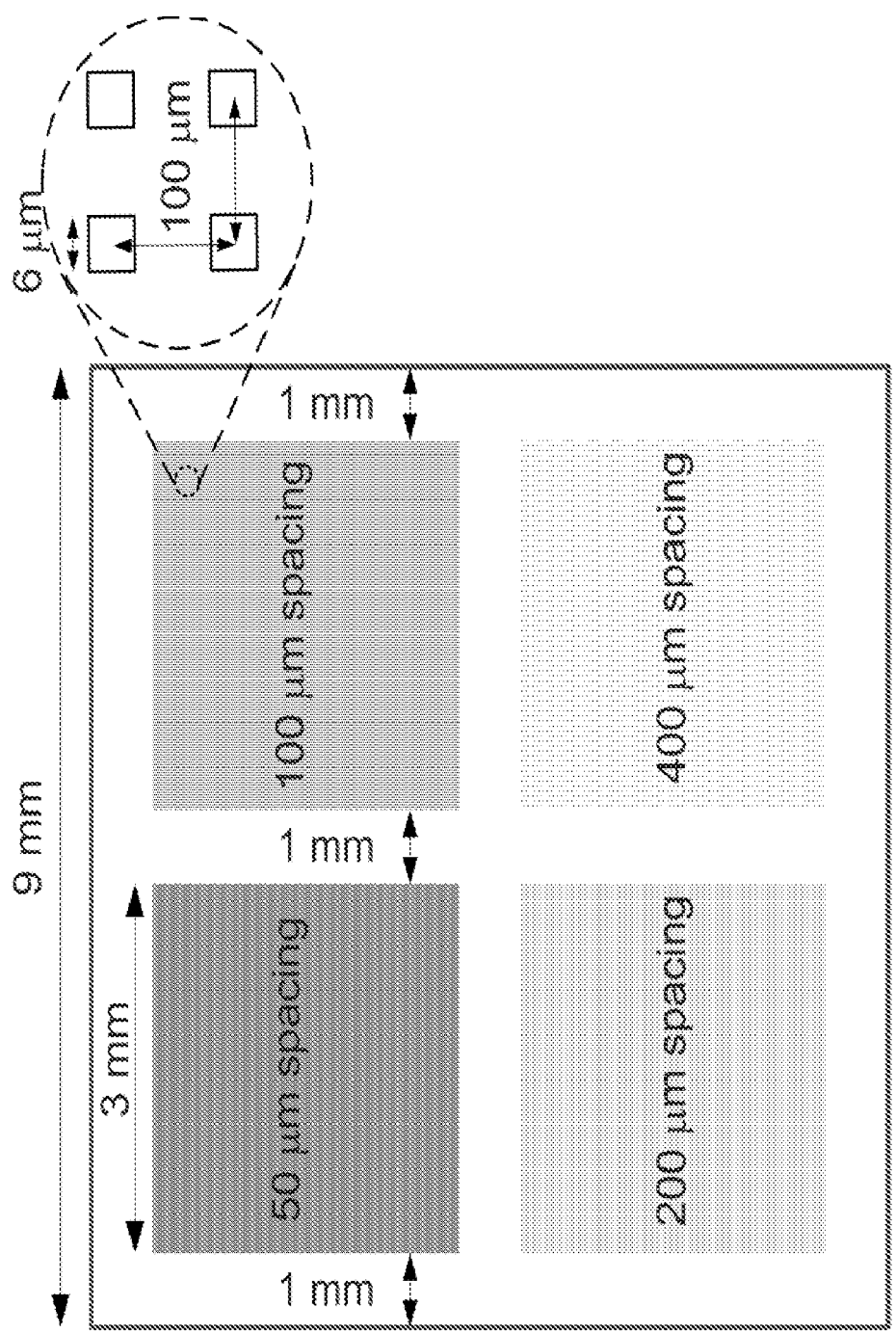
FIG. 2 illustrates the mask design for vertical channel spacing (i.e., density) study.

Although shown as InP on SOI, other materials, both amorphous and non-amorphous, can be used within the scope of the present invention. As shown in FIG. 1, InP epitaxial material is directly bonded onto the SOI wafer, and $H_2O$ molecules migrating to the closest VOC are quenched in the buried oxide (BOX) layer quickly by combining with bridging oxygen ions and forming pairs of stable nonbridging hydroxyl groups (Si—OH). In order to study the effectiveness of this approach, VOC (6×6 µm in dimension) regions with variable channel spacing of 50, 100, 200, and 400 µm in FIG. 2 are patterned on 1.1×1.1 $cm^2$ SOI samples with 1 mm wide VOC-free surrounding boundaries to eliminate potential interaction from the adjacent sections and edges. $O_2$ plasma-assisted wafer bonding process after sample cleaning is then performed to enable InP-SOI spontaneous attachment at room temperature.

Figure 3:
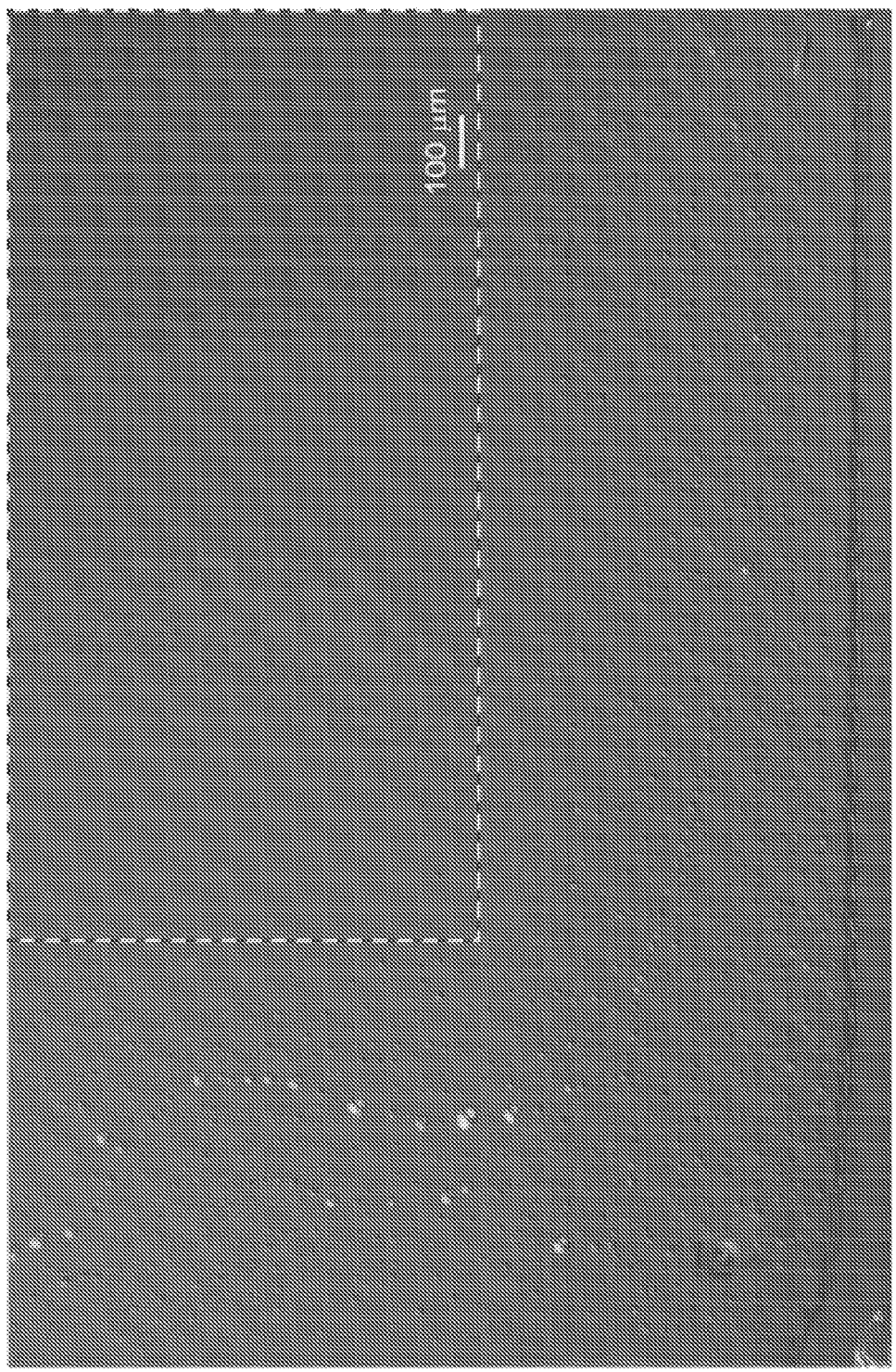
FIG. 3 illustrates a Nomaski mode microscopic image of a directly bonded 2 μm thick InP epitaxial layer attached on the SOI substrate after selectively removing the InP substrate, showing void-free bonding at highlighted area where vertical outgassing channels with 100 μm spacing locate, while a great number of Interface voids (average density of $9 \times 10^3$ $cm^{-2}$, up to $1 \times 10^6$ $cm^{-2}$, diameter 2-20 μm) appear at boundary where no outgassing channels exist.
Figure 4:
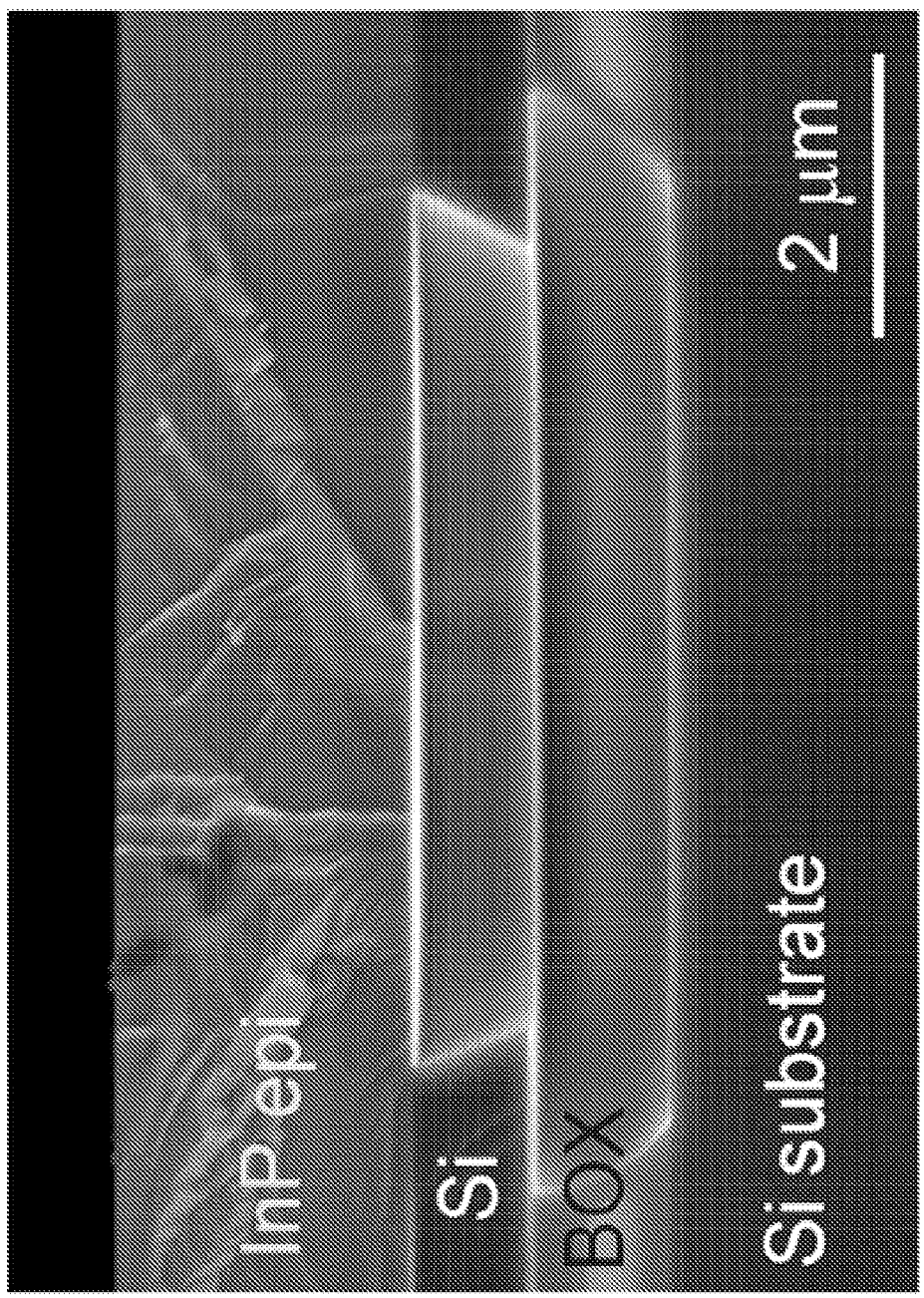
FIG. 4 illustrates a SEM cross-sectional image of a 6 μm wide vertical outgassing channel with InP epitaxial material directly bonded on the top after 2 hour anneal at 300° C.
Figure 5:
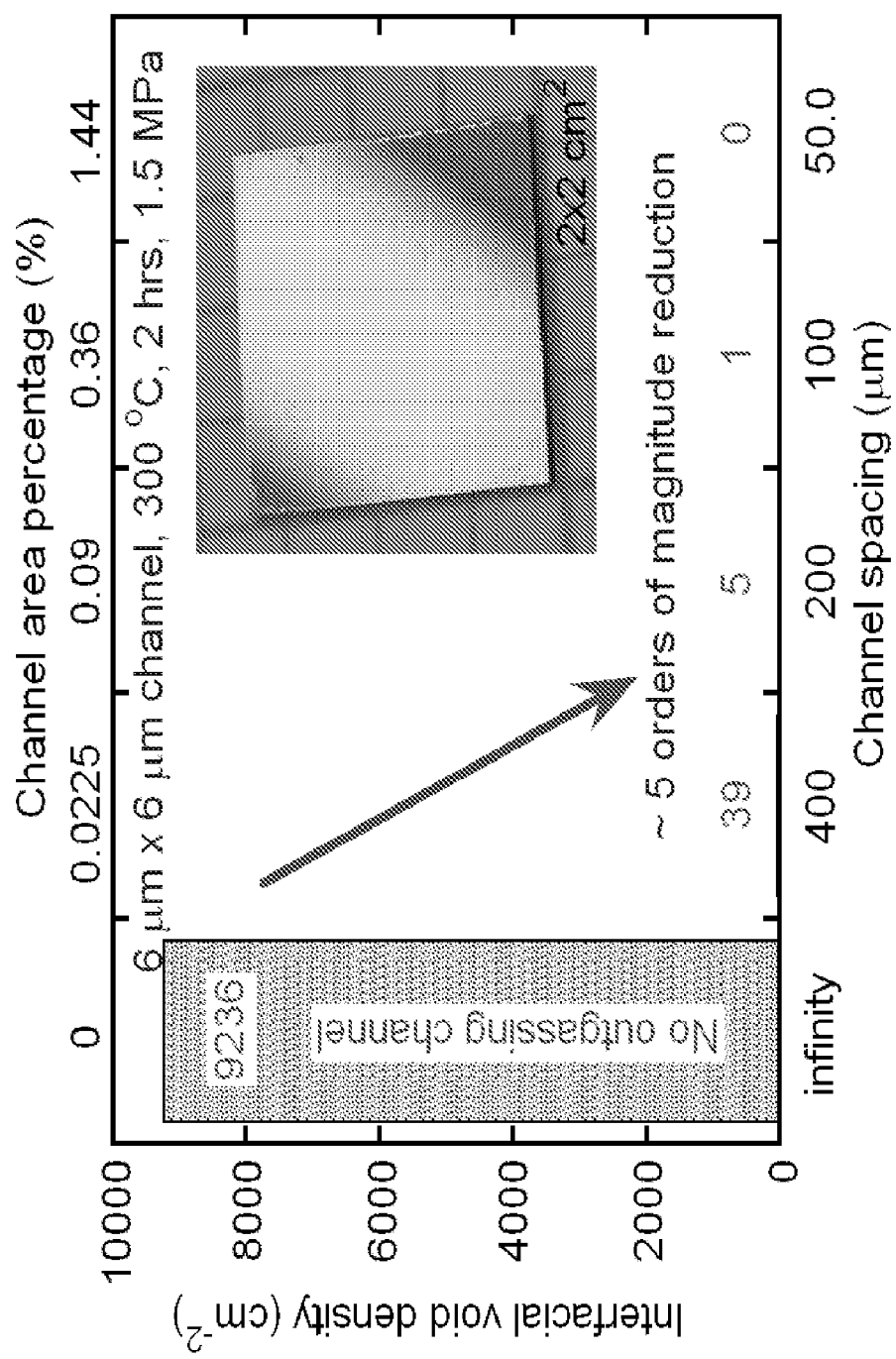
FIG. 5 illustrates an interfacial void density vs. channel spacing and channel area percentage for InP epitaxial layer directly bonded on SOI with variable outgassing channel spacing. The inset shows a photograph of a directly bonded $2 \times 2$ $cm^2$ InP epitaxial material on SOI with vertical outgassing channel design, showing mirror-like, void-free epitaxial layer transfer.
Figure 6:
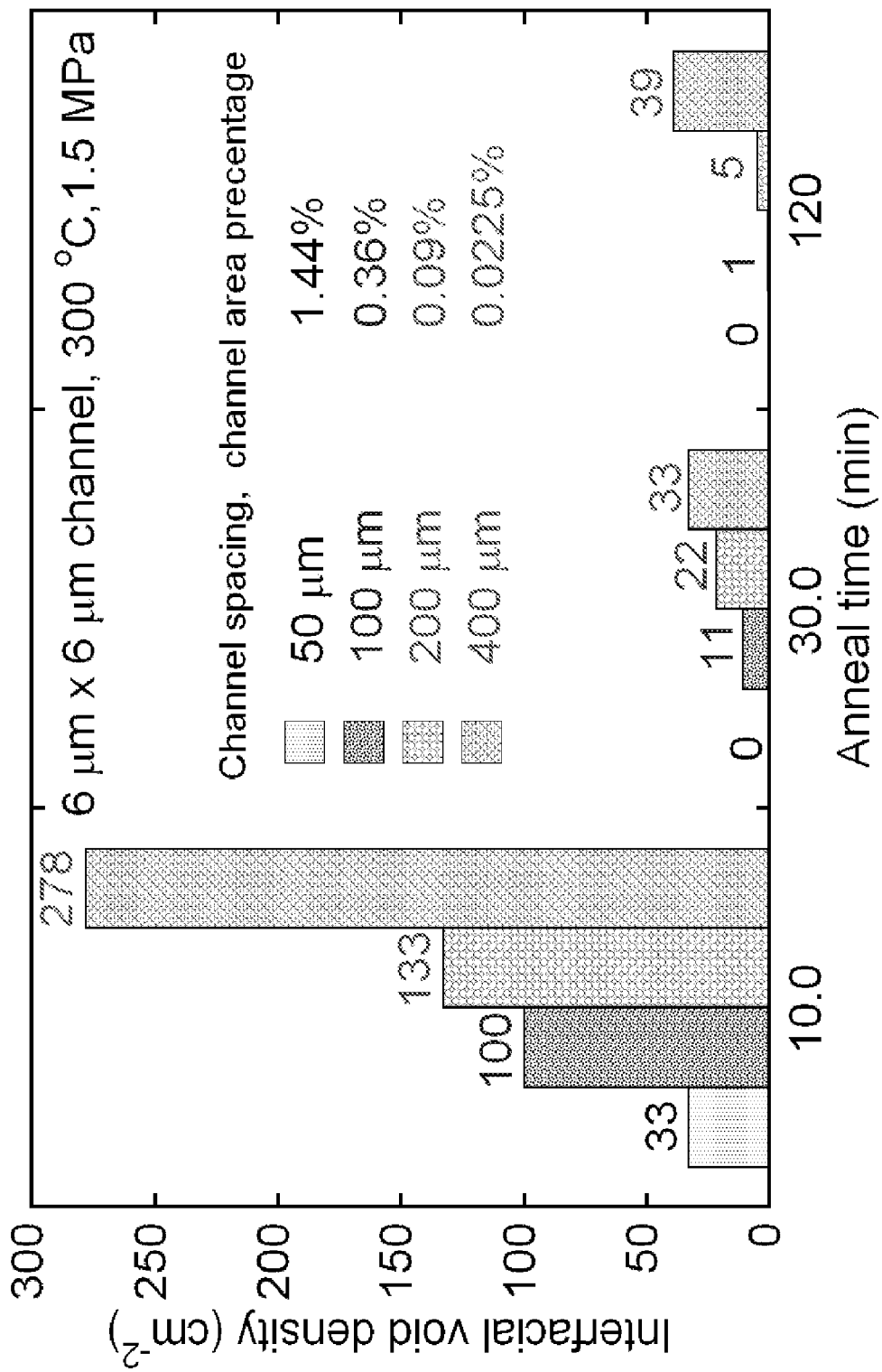
FIG. 6 illustrates an interfacial void density vs. anneal time, showing that short anneal is achievable while low void density is still maintained.

Following a short anneal (10-120 min.) at 300° C. with 1.5 MPa external pressure, InP substrate is selectively removed in HCl solution, resulting in a ~2 µm thick epitaxial layer transfer onto SOI. A microscopic image (50×) in Nomaski mode in FIG. 3 shows a drastic contrast on a 2 hour anneal sample, where bubble-free bonding is achieved at area with VOCs (100 µm spacing) while high-density (average $9\times10^4$ $cm^2$) voids distribute in boundary area uniformly, exhibiting a highly efficient outgassing capability. In VOC region InP epitaxial layer is tightly bonded to SOI as shown in a scanning electron microscopic cross-sectional image (FIG. 4) of a cleaved sample, where no InP deformation is observed in VOC area. Compared with VOC-free, directly bonded sample, interfacial void density has been reduced enormously from a conservative count of 9236 $cm^{-2}$ down to zero in FIG. 5 with little different in term of channel spacing. A small real-state footprint of <1.5% of the total bonding area is also noticed, indicating negligible impact to bonding strength and great freedom in device layout design. The inset photograph of a 2×2 $cm^2$ InP epitaxial layer bonded on SOI exhibits the same void-free bonding, revealing a promising perspective in bonding scalability since $SiO_2$ accommodation capacity per unit volume to $H_2O$ byproduct is identical regardless of the size of wafers. Another merit of VOC design is to enable dramatic reduction in anneal time (FIG. 6) owing to the fast gas molecules diffusion at bonding interface to VOCs. Conventional anneal time of 12-18 hours required to bond the same 1 $cm^2$ InP sample onto SOI in our lab has been reduced to 30 min while void-free bonding is still attainable in VOC region with 50 µm spacing. Further anneal time reduction is limited by gas molecules migration to VOCs, which can be accomplished by decreasing the channel spacing. It is finally noted that VOC approach is as well applicable in a variety of other bonding situations where gas byproducts need to be removed before strong bond is initiated.

Discussion

Discussed herein are embodiments of a highly efficient scheme for low-temperature, void-free InP-to-Silicon direct wafer bonding on a SOI substrate. By etching an array of small through-holes in the top silicon layer, generated gas byproducts ($H_2O$, $H_2$) from bonding polymerization reactions and gaseous hydrocarbon can be absorbed and diffuse in the buried oxide layer, resulting in up to 5 orders of magnitude interfacial void density reduction (from >50,000 $cm^{-2}$ to $\leq 3$ $cm^{-2}$). The required anneal time is reduced to less than 30 minutes, a ~100× improvement compared to the previous outgassing design as well. Comprehensive studies in associated processing details, bonding surface energy, universality and stability are presented. Successful 50, 75 and 100 mm InP epitaxial layer transfer to the SOI substrate is demonstrated, which indicates total elimination of outgassing issue regardless of the wafer bonding dimension. Several incidental advantages leading to flexible device design, low fabrication cost, and potential bonding strain relief are also discussed.

Introduction

Semiconductor wafer bonding has represented as an attractive, viable, large-scale hybrid material integration approach recently with the development of semiconductor wafer manufacture technology. When two mirror-polished, flat, clean wafers are brought into contact together in room temperature, regardless of wafer material and size, Van der Waals force or hydrogen bond holds two wafers in position to allow bonded pair transferred to the following stage, for example, thermal anneal for fusion bonding,[1] electric field accession for anodic bonding[2] or long time storage for room temperature bonding[3], all for enhancing bonding surface energy. Since polymerization reactions are usually involved in the surface bond formation for fusion bonding and anodic bonding, against the adhesive bonding using interfacial adhesive polymer materials, removing the gas byproducts can be helpful to achieve strong covalent bonds. Eqs. (1)-(2), and (3) represent the fundamental polymerization reactions in Si-based hydrophilic and hydrophobic direct bonding[4], respectively, all generating gas byproducts ($H_2$ and $H_2O$) which have been proved to be the major trapped gases at bonding interface experimentally.[5] The significant amount of gas formation and desorption of 2-3 monolayers of water molecules at the bonding interface of hydrophilic wafers after room-temperature mating, plus gaseous hydrocarbon from organic surface contamination during anneal, can lead to high internal pressure,[6] subsequently resulting in local debonding, i.e., interface void formation. Typically, gas molecules with small atom size, such as $H_2$, can diffuse out through the microroughness at the interface gradually or enter porous medium (such as $SiO_2$)

quickly, especially at high temperatures. Interfacial voids can also be filled up due to native or thermal oxide viscous flow at high temperatures (>800° C.).[7] Elevated temperature anneal is therefore preferred naturally due to resulted void-free, strong bonding and its processing simplicity with no need of prebond surface activation, for example, manufacturing of commercial wafer-bonded silicon-on-insulator (SOI) wafers up to 300 mm in diameters.

$$Si-OH+Si-OH \rightarrow Si-O-Si+HOH \quad (1)$$

$$Si+2H_2O \rightarrow SiO_2+2H_2(g) \quad (2)$$

$$Si-H+Si-H \rightarrow Si-Si+H_2(g) \quad (3)$$

However, high temperature anneal is normally forbidden in most of compound semiconductors-to-silicon bonding due to thermal expansion mismatch and potential thermal material degradation or decomposition of compound semiconductors. Similar to Eq. (1), hydroxides of some metals M with high electronegativity.[9] are also able to polymerize to form covalent bonds at low temperatures as shown in Eq. (4). Bonding-related residual gases are, therefore, inherent to the bonding mechanisms in general. Embedding a thick layer of porous material such as thermal $SiO_2$ or plasma-enhanced chemical vapor deposition (PECVD) dielectrics has been reported as an efficient outgassing medium for $H_2O$ and $H_2$ diffusion and absorption,[10,11] but it is not applicable for situations where true integration with proximity of two mating materials is needed. Different prebond surface treatment methods have also been employed to obtain strong InP-to-Si bonding by partially replacing surface hydroxyl (—OH) groups to other terminating groups[12,13] though the question of how to effectively remove gas byproducts still remains.

$$Si-OH+M-OH \rightarrow Si-O-M+HOH \quad (4)$$

Recently a hybrid Si evanescent device platform has been developed to allow active optoelectronic components to be fabricated on the SOI substrate by low-temperature, $O_2$-plasma assisted InP-to-Si wafer bonding,[14,15] representing a breakthrough towards realization of low-cost Si-based all optical communications. Achieving a strong, void-free bonding is of direct impact to device yield, performance and reliability. Since light travels in a type of hybrid waveguide (in a few micrometer dimension) composed of both thin Si device layer in the SOI substrate and thin InP-based compound semiconductor epitaxial layers,[15,16] even small local delamination in micrometer regime may cause optical scattering or loss of the hybrid waveguide structure. Top-view Nomaski-mode microscopic images (50×) in FIGS. 1(a) and (b) show the transfer of ~2 μm thick InP epitaxial layers onto the SOI substrate after anneal at 300° C. for 2 hours and 15 hours, respectively. Evenly distributed interfacial voids of 2~20 μm in diameters with a density of ~55,093 cm$^{-2}$ indicate serious outgassing issue in FIG. 7(a). Extended anneal from 2 hours to 15 hours in FIG. 7(b) reduces the void density to ~27,546 cm$^{-2}$, while the outgassing issue is not suppressed because bigger size voids appear due to gas aggregation from adjacent voids.

Figure 7:
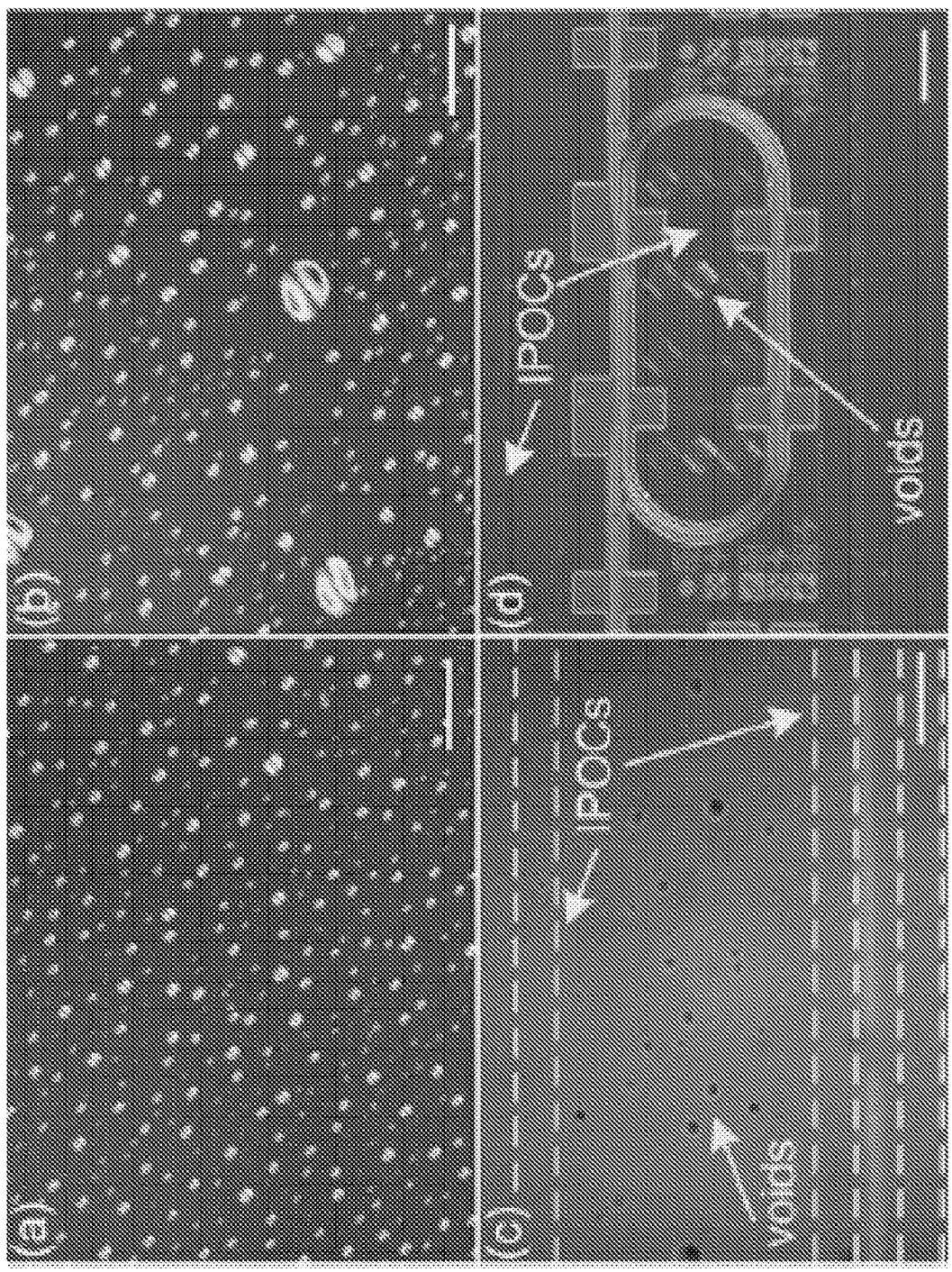
FIG. 7 illustrates Nomaski-mode microscopic images of InP thin epitaxial layers transferred to SOI substrate after 300° C. anneal (a) for 2 hours with no outgassing channel; (b) for 15 hours with no outgassing channel; (c) for 15 hours with only in-plane outgassing channels (IPOCs) highlighted by yellow dash lines; and (d) for 15 hours with in-plane outgassing channels and also close-loop device pattern on the SOI substrate. Scale bars in all figures are 200 μm.

An empirical way to help outgassing is to create suitable "drainage" pipelines by etching ~10 μm wide trenches or grooves (called "in-plane outgassing channels (IPOCs)" in this work) on single or both wafers and extend them to the chip edges so that vacuum in postbond anneal helps pulling gas molecules out of bonding interface through IPOCs. FIG. 7(c) shows the top-view Nomaski-mode microscopic image of the InP epitaxial layers transferred to the SOI substrate with highlighted IPOCs on the SOI substrate. The bonded pair is annealed at 300° C. in a 5×10$^{-4}$ Torr vacuum for 15 hours. In contrast to FIGS. 7(a) and (b) with no any sort of outgassing channels, the area right above IPOCs in FIG. 7(c) exhibits no void formation while some of them appear in 500 μm-wide channel-free central area, indicating that the effectiveness of IPOCs depends on the spacing of channels. However, some close-loop layout on the SOI results in the impossibility of gas byproducts inside the loop diffusing out through IPOCs, causing voids at channel joints as shown in FIG. 7(d) of a Si hybrid evanescent racetrack-ring resonator for example. In addition to the disadvantage of inflexibility in SOI layout design, IPOCs also become hidden trouble that undesirable gas and liquid can diffuse back in during post-bonding device fabrication and operation, which is likely to cause local debonding and device reliability issue.

Embodiments of the present invention demonstrates the design of a type of highly efficient vertical outgassing channels (VOCs) for achieving low-temperature, robust, void-free thin InP epitaxial layer-to-SOI direct bonding. The VOCs concept is first presented, followed by the discussion of fabrication process. The outgassing effectiveness of VOCs, which is evaluated by comparing interface void density on transferred thin InP epitaxial layers, is studied by varying VOCs' spacing S (i.e. density) and dimension t. Over 5 orders of magnitude void density reduction to essentially void-free bonding interface is demonstrated when an optimal VOC scheme is employed. Up to 100× anneal time reduction is also showed to be sufficient for desirable bonding quality and surface energy, highly improving the production efficiency. The universality and robustness of this bonding process with VOCs is manifested on successful transfer of III-V material with relatively poor bondability to the SOI substrate. Successful direct bonding of 50, 75 mm and 100 mm diameter InP epitaxial layers onto the SOI substrate is demonstrated in the end to show the scalability of the bonding process.

Outgassing Principle of VOCS

Figure 8:
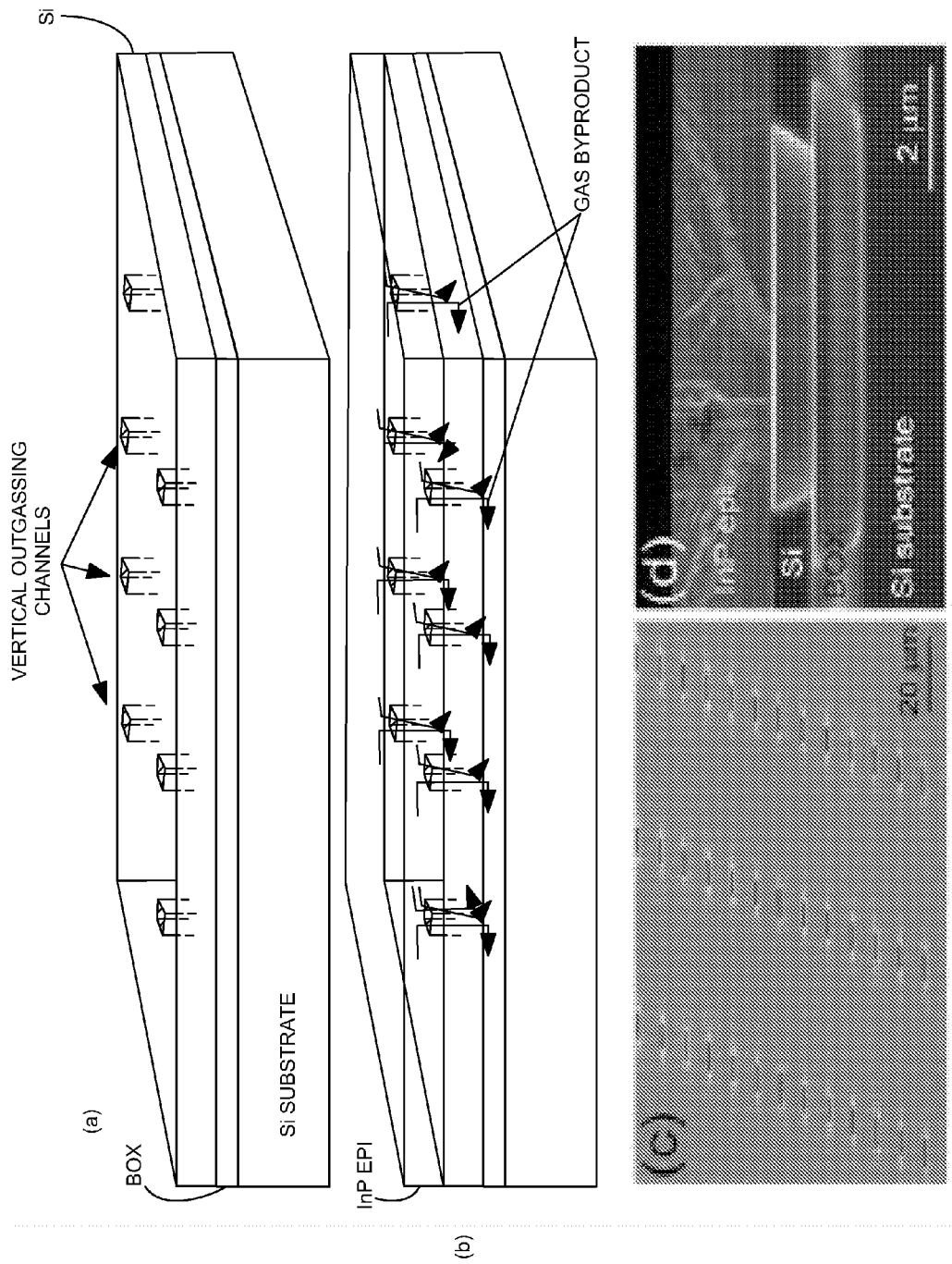
FIG. 8 illustrates schematic cartoons of vertical outgassing channels (VOCs) on the SOI substrate (a) before and (b) after contacting with InP epitaxial layers; (c) Side-view of SEM image showing etched VOCs; (d) SEM cross sectional-view of VOCs with InP epitaxial layers bonded on the top, showing intimate contact with no deformation or delamination.

As illustrated in the cartoon image of FIG. 8(a), in an embodiment VOCs are essentially an array of holes with few micrometers in size and etched through the top Si device layer to the underneath buried oxide (BOX) layer prior to contact with III-V material. Generated gas byproduct molecules plus small amount of trapped air molecules and even gaseous impurity can migrate to the closest VOC and can promptly be absorbed by BOX in FIG. 7(b), and gradually diffuse out through BOX layer due to its open network with only 43% of occupied lattice space[17] and large diffusion cross-section (0.3-3 μm thick in general). The underlying chemistry of outgassing mechanism is revealed in the Eqs. (5)-(7)[18].

$$H_2O+SiO_2 \rightarrow Si-OH+OH-Si \quad (5)$$

$$2Si-OH+2Si \rightarrow 2Si-O-Si+H_2(g) \quad (6)$$

$$Si-O+H_2 \rightarrow Si-OH+OH-Si \quad (7)$$

It is well-known that water vapor can reside in molecular form at interstitial sites in $SiO_2$ to a depth of several hundred of angstroms in room temperature. Upon entering the oxide network, it combines with bridging oxygen ions to form pairs of stable nonbridging hydroxyl groups, a process described in Eq. (5).[18,19] The presence of these hydroxyl groups in the oxide also tends to render it more porous to diffusing species,[18] which is beneficial to outgassing as well. Large Hydrogen permeability in thermal $SiO_2$[20] expedites the absorption of generated $H_2$ in Eqs. (2) and (7). Trapped Oxygen molecules are more inert and do not react with the oxide network, but can react with Si or diffuse as interstitial molecules in $SiO_2$ with an energy barrier sensitive to the local oxide ring topology.[19]

FIG. 8(c) is a side-view scanning electron microscope (SEM) image of VOCs with channel dimension t=6 μm squares and S=100 μm center-to-center spacing. SEM cross-sectional view of a corresponding VOC with ~2 μm III-V epitaxial layers bonded on the top is shown in FIG. 8(d), demonstrating intimate contact of III-V and Si with no III-V deformation above VOC. The absence and undercut of BOX is due to wet etch of $SiO_2$ hard mask in HF solution after transferring VOC pattern from the hard mask to the Si device layer, and has no negative impact to the VOC outgassing effectiveness. The detailed process flow is discussed below.

Experiment

VOC Patterning and Wafer Bonding Process

Commercially available 150 mm (100) SOI wafers (Boron doped, 1-10 Ohm-cm) used in this work contain 1 μm Si device layer and 1 μm buried oxide (BOX) layer. Although described as performed, other thicknesses and process parameters are possible and within the scope of the present invention. Patterning VOCs in the SOI substrate starts from growing 1 μm $SiO_2$ in wet oxidation to be the hard mask after a modified RCA1 ($NH_4OH:H_2O_2:H_2O=0.2:1:5$, 80° C.) cleaning for 10 minutes[21] and native oxide removal in HF solution (0.5%) for 30 seconds. Standard contact photolithography is conducted, followed by transferring VOC pattern to $SiO_2$ hard mask in buffered HF (BHF) solution ($HF:H_2O=1:7$) for ~10 minutes. Upon stripping off photoresist in Acetone, the pattern is then further transferred to Si device layer by inductively coupled plasma reactive ion etching (ICP-RIE) silicon etch in $BCl_3/Cl_2$ plasma. Prior to removing the $SiO_2$ hard mask, the SOI sample is cleaned again in a solution of $H_2SO_4:H_2O_2=3:1$ at 100° C. for 10 minutes, leaving a dust-free surface. The InP-based III-V sample cleaved from the 50 mm metal-organic chemical vapor deposition (MOCVD)-grown epitaxial wafer is cleaned in Acetone and Isopropyl Alcohol with gentle physical swab. After removing the $SiO_2$ hardmask on the SOI sample and native oxide on the III-V sample in BHF and NH4OH (39%) solutions, respectively, $O_2$ plasma surface treatment is proceeded on both samples in a commercial EVG 801 LowTemp Plasma Activation System for 30 seconds. A thin (<5 nm) layer of highly strained native oxide is grown on both SOI and III-V samples,[22] resulting in a very reactive hydrophilic surface. Subsequently high surface hydroxyl groups (—OH) density after contact with solution rich of hydroxyl groups, for example $H_2O$ or $H_2O$-rich solutions, is attainable.[4] So the final activation step involves terminating the hydrophilic surfaces with hydroxyl groups. It has been reported that surface activation in $NH_4OH$ solution resulted in higher bonding surface energy due to the conversion of some Si—OH to Si—$NH_2$ with higher bond strength.[21,23] Instead of dipping the samples in $NH_4OH$ solution directly,[21,23] a $NH_4OH$ vaporization process is developed to result in a more uniform and cleaner surface activation[24] The SOI and III-V samples are placed on a 125° C. hotplate with a glass cover for 5 minutes to introduce $NH_4OH$ vapor and vaporize liquid trapped in the VOC cavities, avoiding the gasification in the following elevated temperature anneal which can subsequently cause debonding. Spontaneous mating at room temperature is then carried out manually. Further annealing at 300° C. is conducted in a commercial Suss SB6E wafer bonder to obtain strong covalent bonding. Relatively high external pressure is required to obtain high quality bonding, which is discussed below. The InP substrate is finally etched off in a solution of $HCl:H_2O=3:1$ at room temperature, leaving 200 nm InGaAs etch stop layer and the rest of 2 μm thick InP-based epitaxial layers on the SOI substrate. Due to the fragility and pliability of thin InP epitaxial layers, small deformation due to local internal pressure from outgassing or stress appears instantly after the substrate is removed. The interfacial void density is then obtained by carefully counting void number under a microscope in Nomaski-mode for the best contrast.

Design of Experiment (DOE)

Figure 9:
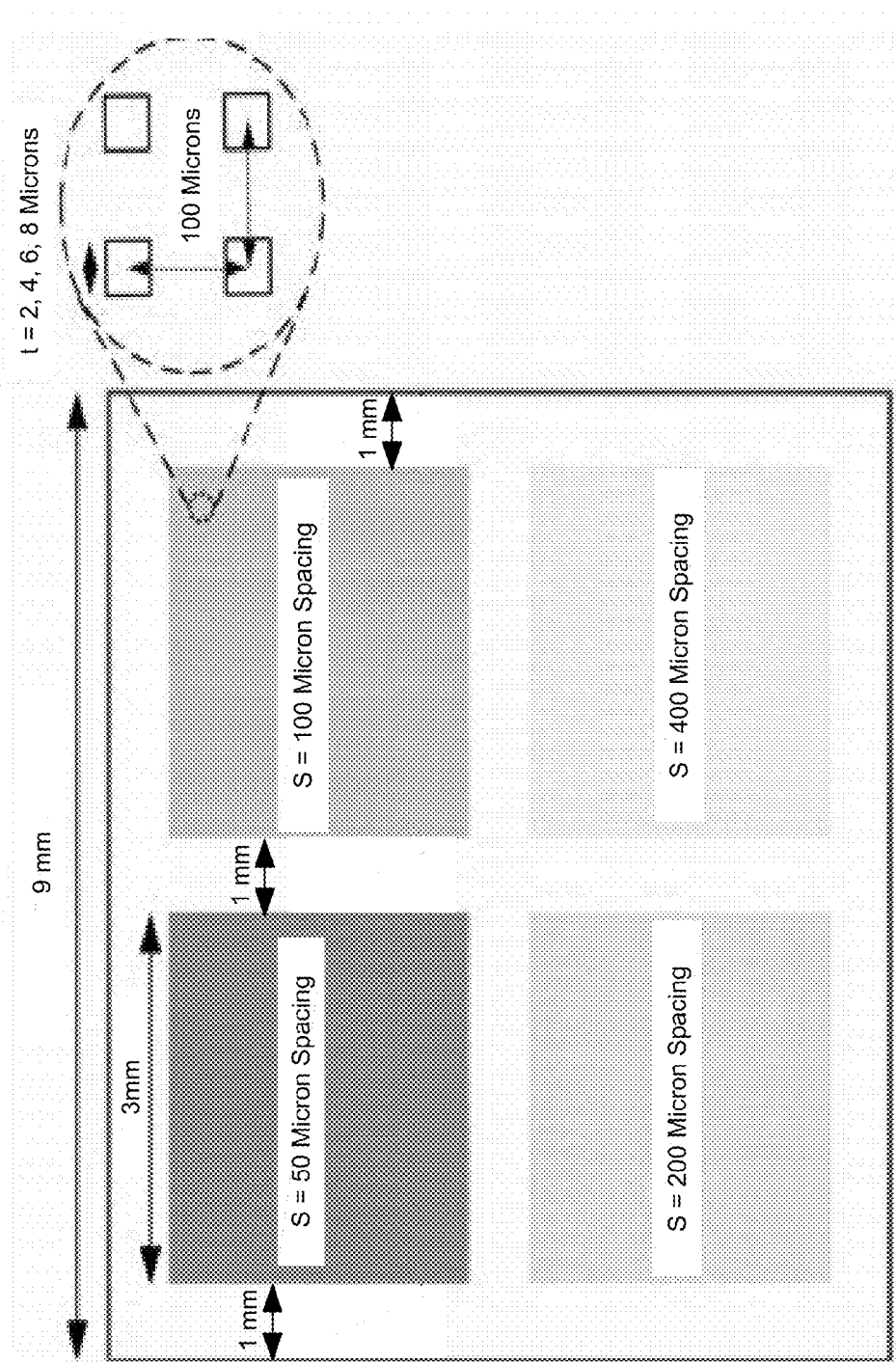
FIG. 9 illustrates VOC pattern design of experiment to study outgassing efficiency as a function of channel spacing S and size t.

In order to study the outgassing efficiency of VOCs, a pattern with variable VOC spacing S and dimension t was designed. FIG. 9 shows the VOC mask of a 9×9 $mm^2$ square area for patterning 1×1 $cm^2$ SOI sample with 1 mm wide stripe region around the edge for photoresist edge bead removal. Four 3×3 $mm^2$ square regions with VOC spacing of 50, 100, 200, and 400 μm are located on the 9×9 $mm^2$ mask area with 1 mm VOC-free margin to each other and the sample edge, minimizing the interaction among different regions and possible gas product diffusion and escape from the sample edge. Square shape is used for all VOCs with the dimension varying from 2, 4, 6, to 8 μm on four respective mask areas.

Results and Discussion

Interfacial Void Density Studies

Red dash-line boxes in FIGS. 10(a) and (b) of Nomaski-mode microscopic images (50×) highlight a VOC region of S=50 μm around the sample corner, and regions of S=50 μm (left) and S=100 μm (right) with 1 mm VOC-free margin in between, respectively. The actual VOCs on the SOI substrate are about 9×9 $μm^2$ square holes with slightly rounded angles due to isotropic BHF wet etch in patterning the $SiO_2$ hard mask. The bonded pair is annealed at 300° C. for only 30 minutes with about 3 MPa external pressure applied. Evident void density reduction down to nearly zero is visible in VOC region of FIG. 10(a) while a great number of uniformly distributed voids still exist at VOC-free corner with density slightly decreasing towards VOC region due to smaller diffusion path to VOCs. A similar situation is exhibited in FIG. 10(b) where VOC-free central area with many voids is sandwiched by void-free S=50 μm and S=100 μm regions.

Figure 11:
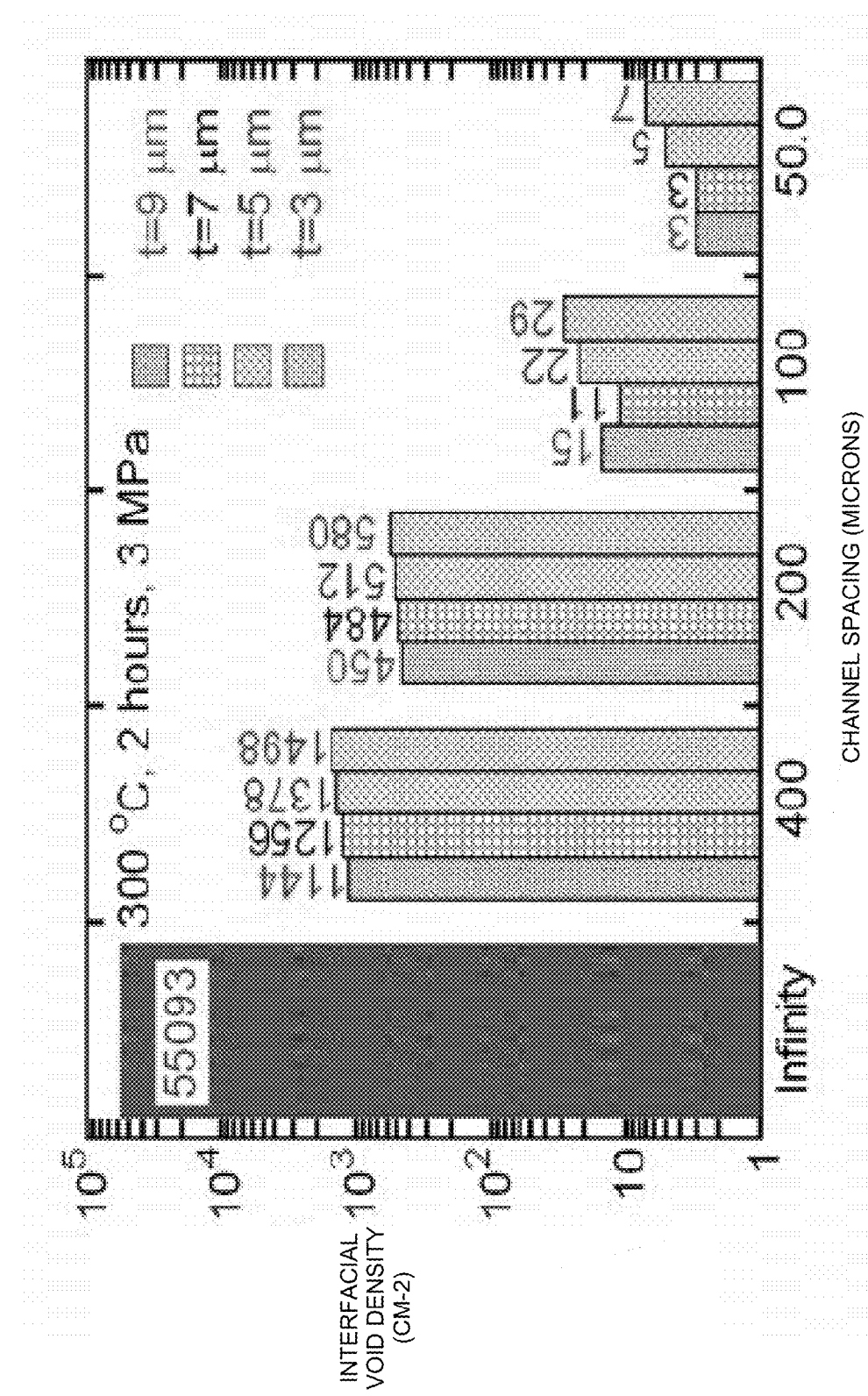
FIG. 11 illustrates interfacial void density vs. VOC spacing of S=400, 200, 100 and 50 μm, and size of t=9, 7, 5 and 3 μm for bonded pairs annealed for 2 hours at 300° C. with 3 MPa external pressure. Void density on the sample in FIG. 7(a) is plotted as a reference.

FIG. 11 represents the relationship of interfacial void density vs. channel spacing S with different channel dimension t for bonded pairs after 300° C. anneal for 2 hours. Dramatic void density reduction up to 5 orders of magnitude is achieved from the sample with no outgassing channel to that of S=50 μm region. Decreasing channel spacing S, i.e. increasing channel density, greatly enhances the possibility for gas byproducts and monolayers of surface water to migrate to VOCs and subsequently quenched by the BOX layer, before aggregating around preferable sites, such as hydrocarbon surface contamination and surface defects.[5,11] Compared with bonded pairs without outgassing channel in FIGS. 7(a) and (b), the sample with S=400 μm already reduces the void density by more than 36×. Bonded pair with VOC of S=100 μm is equivalently good as the one with IPOCs which is required to anneal for 15-18 hours instead. For the case of S=50 μm, less than 10 $cm^{-2}$ void density for voids less than 20 μm in diameter is considered to be the outgassing issue completely eliminated since it becomes impossible to differentiate outgassing-induced voids (i.e., "intrinsic" voids) with surface contamination and surface defect-induced ones (i.e., "extrinsic" voids) for manually cleaning and bonding in a Class 100-1000 cleanroom. Channel spacing S, therefore, is the first-order influence factor for outgassing. FIG. 11 shows that larger channel size t also contributes to slightly lower void density since larger channel and exposed BOX square area offers stronger gas byproduct accommodation capability in the unit time period. Larger t also means slightly smaller effective contact area, i.e., less surface hydroxyl groups to contribute gas byproduct generation. Hence, parameter t becomes the second-order influence factor for outgassing. It is noted that void density data in FIG. 11 are average numbers obtained from bonding 1 cm² samples with four isolated channel regions (FIG. 9) and 1 cm² individual ones with single VOC scheme.

It is well-known that longer anneal time normally leads to stronger bonding surface energy which starts saturating to a maximum value after certain period of anneal time when generated gas byproducts are removed from the bonding interface completely, either by absorption or diffusion.[11,25] Thus, it is of interest to determine if there is a similar outgassing efficiency threshold in term of anneal time. Interfacial void density as a function of anneal time at 300° C. is revealed in FIG. 12. Similar outgassing efficiency is found on bonded pairs annealed for 2 hours and 30 minutes while the one with only 10 minute anneal shows significantly higher void density, indicating that outgassing efficiency firstly relies on the gas transportation to the VOCs, a function of time periods. The minimum anneal time at 300° C. anneal temperature in this work is likely to be around 30 minutes for the best outgassing efficiency. Further anneal time reduction in this temperature is believed to be attainable by reducing VOC spacing S. We note here that previous low-temperature bonding with IPOCs needs 15~18-hour anneal to obtain low void density (10-20 cm$^{-2}$) bonding, comparable to that of 30-minute anneal with VOC design. Zhang et al. studied the void formation in low-temperature Si—Si bonding without any type of outgassing channels.[11] Quite long anneal time (>100 hours in some cases) was founded necessary to reach saturation of bonding polymerization reactions, and stop new void formation,[11] which supports the argument here that the efficiency in gas byproducts removal determines the bonding quality and required anneal time, i.e. production efficiency.

Unlike the bonding process with IPOCs, however, embodiments of the new process with VOC design uses higher external pressure to hold samples in position and prevent the debonding or local deformation of III-V material since trapped air in VOCs expands as soon as temperature ramping begins. Assuming a potentially worst case that the mass of trapped cleanroom ambient air (99% of $O_2$ and $N_2$) is constant (i.e., no absorption or diffusion in Si or BOX layer) through the entire temperature cycling from room temperature (20° C.) to 300° C. and back to room temperature, the additional pressure can be calculated from the well-known Gay-Lussac's Law in Eq. 8 since $O_2$ and $N_2$ can be treated as an ideal gas at relatively low temperature. T. $P_T$ and $P_0$ in Eq. 8 represent the temperature T in Celsius degree and the pressures at temperature T and 0, respectively. The maximum internal pressure of $P_{300° C.}$ in a VOC cavity is, therefore, 1.96 times of the pressure at 20° C., $P_{20° C.}$ at which VOC cavity is formed upon spontaneous mating. $P_{20° C.}$ in this work is also equal to the pressure of 1.24 MPa routinely used for bonding pairs with IPOCs in our lab in order to minimize the surface microroughness on III-V surface, because no gas expansion takes place in vacuum anneal chamber for IPOC case. Thus, a pressure of 2.43 MPa is used to overcome the gas expansion and achieve the same quality bonding for VOC case as that of IPOC case.

$$P_T = P_0\left(1 + \frac{1}{273.15}T\right) \quad (8)$$

Figure 13:
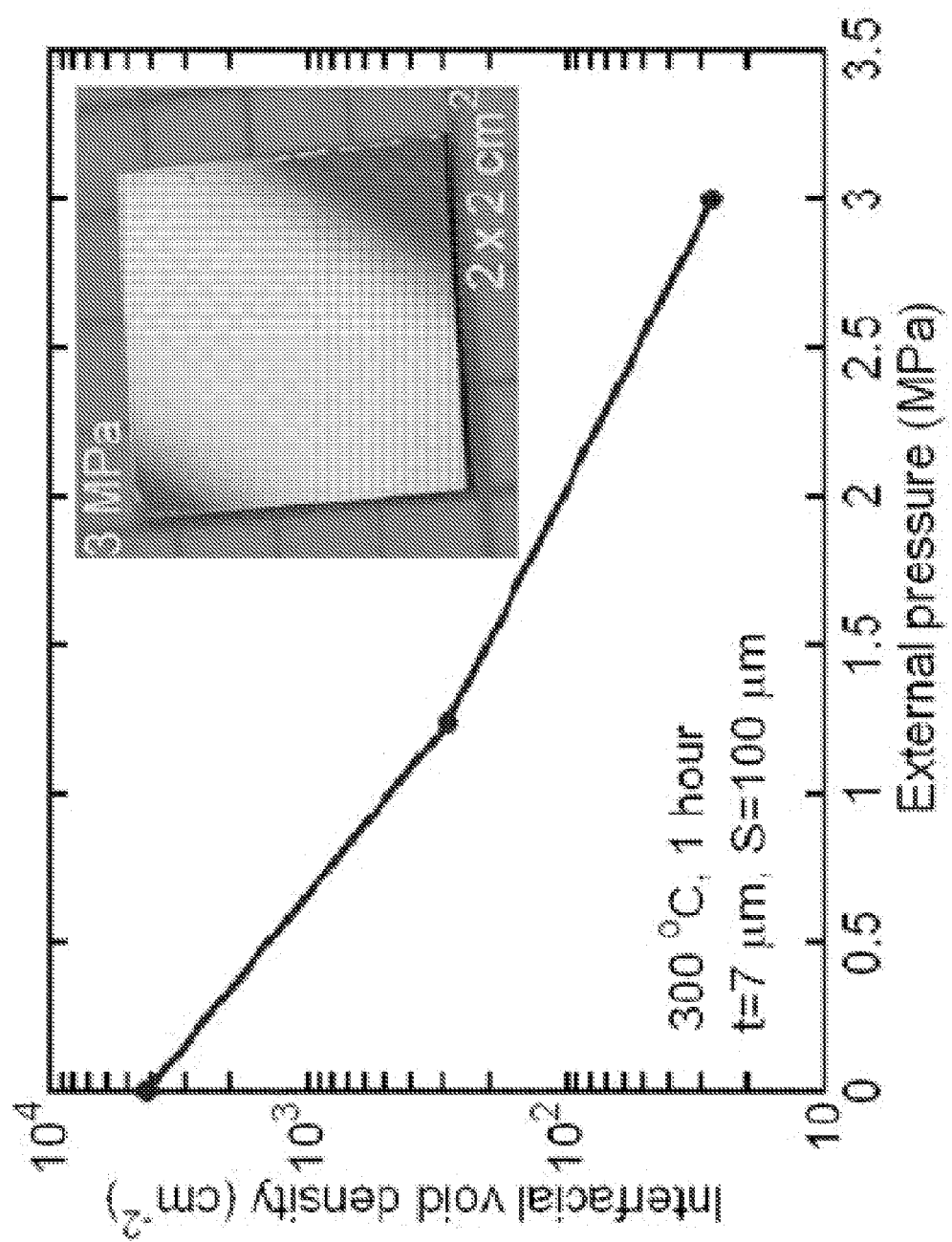
FIG. 13 illustrates interfacial void density as a function of external pressure for bonded pairs of t=7 μm and S=100 μm after 1 hour anneal at 300° C., showing that 3 MPa is required for VOC design in contrast to conventional 1.24 MPa pressure used for IPOC design. Inset: a $2 \times 2$ $cm^2$ mirror-like InP epitaxial layers transferred to the SOI substrate with 3 MPa pressure applied.

FIG. 13 shows the experimental data of interfacial void density vs. external pressure for bonded pairs with t=7 μm and S=100 μm after 300° C. anneal for 1 hour. Extremely high average void density over 4000 cm$^{-2}$ appears at bonded pair with no external pressure applied as expected, and decreases to around 290 cm$^{-2}$ when the regular 1.24 MPa used for IPOC case is applied. Low void density of 27 cm$^{-2}$, comparable to IPOC case (18 hour anneal), is obtained when pressure is increased to 3 MPa, 2.41× of 1.24 MPa. The slightly higher pressure in experiments than calculation from Gay-Lussac's model is believed due to the contribution of aggregation of $H_2O$ gas byproduct and small amount of trapped, tiny airborne organic particles, plus the potential error of the ideal Gay-Lussac's model for the actual situation. Inset image in FIG. 13 is a 2×2 cm² sample annealed for 2 hours at 300° C. with 3 MPa external pressure. A mirror-like epitaxial layer transfer is achieved after selectively removing the InP substrate. Lower pressure would be sufficient if spontaneous mating at room temperature is conducted in a vacuum environment.

Bonding Strength Characterization

Figure 14:
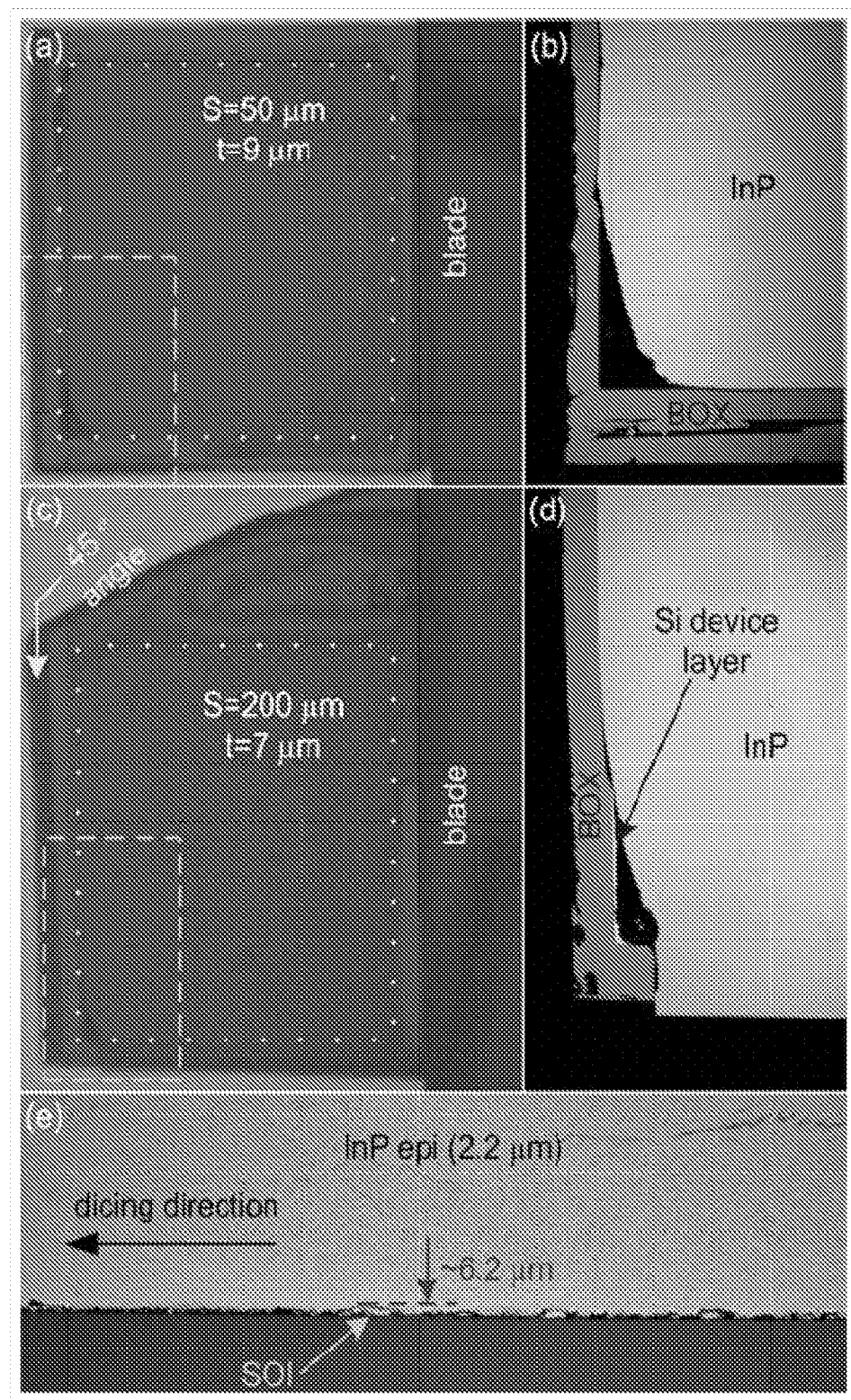
FIG. 14 illustrates infrared transmission images of (a) S=50 μm and t=9 μm bonded pair and (c) S=100 μm and t=7 μm bonded pair after 300° C. anneal for 30 minutes with VOC region highlighted by yellow dot-line box. (b) and (d) are top-view microscopic images of (a) and (c), respectively, further demonstrate the strong bond at VOC regions. (e) Top-view microscopic image of a diced bonded sample with only 2 μm thick InP epitaxial layers bonded on the SOI substrate. Maximum of 6.2 μm chipping indicates high surface energy at the bonding interface.

It is not practical to apply external pressure during post-bonding device processing (up to 320° C.) after removing the InP substrate. Prevention of III-V delamination due to trapped gas expansion in VOC cavities relies on the surface energy of bonded area around VOCs. Hence, bonding strength (i.e., surface energy) after anneal stands as another factor in evaluating the bonding quality. In a Class 1000 cleanroom environment the standard crack-opening method[26] is performed on about 1×1 cm² bonded pairs which are annealed for only 30 minutes since it appears to be sufficient for efficient outgassing in FIG. 12. Longer anneal time normally results in equal or higher surface energy[25] so that only 30-minute annealed samples are used for this measurement. Two opposite edges of SOI samples used in this measurement are angularly polished to a 45° angle to the bonding surface, allowing a 100 μm thin blade inserted into the bonding interface easily, correctly, and repeatably. The top InP samples with ~400 μm InP substrate remaining, however, are all broken at or before reaching the boundary of contacted area consistently as shown in void-free infrared transmission images of FIGS. 14(a)-(d), when the blade is attempted to insert through, resulting in failure to determine the equilibrium crack length. Yellow dot-line in FIGS. 14(a) and (c) highlights the contacted areas with respective VOCs of S=50 μm and t=9 μm, and S=200 μm and t=7 μm, showing the crack of InP substrate close the edge of the VOC pattern. Blade stops at the positions shown in the figures when crack of InP presents. FIGS. 14(b) and (c), the respective top-view microscopic (25×) images for the blue dash-line boxes in FIGS. 14(a) and (c), further confirm the maintaining of intimate InP-SOI contact so that InP breakage follows the contact boundary strictly. A small fringe of the top Si layer, between exposed BOX green border (from the step of photoresist edge bead removal) and InP substrate in FIG. 14(d), indicates relatively lower surface energy compared to the bonded pair with S=50 μm and t=9 μm in FIG. 14(b), which is expected due to significantly higher void density shown in FIG. 11. The crack of the InP substrate on small size samples indicates the likelihood of the bonding surface energy higher than the fracture energy of bulk InP,[24] a similar case that Maszara reported in measuring hydrophilic Si—Si bond as well.[1] Accurate determination of the bonding surface energy requires a thinner blade and larger size samples with thicker InP substrate, which is much more expensive and beyond the scope of this work.

Alternatively, III-V-SOI bonded samples experience a harsh dicing test, a standard process for fabricating the Febry-Perot cavity devices as well. The bonded sample with only 2.2 μm thick epitaxial layers on the SOI substrate is cut by a 100 μm thick blade with over 10,000 rounds/min spin rate.

Though the III-V side is up and there is no surface protection during dicing, the chipping of III-V epitaxial layer is no more than 6.2 µm and follows the SOI fringe consistently in FIG. 14(e), also demonstrating the achievement of strong bonding. The III-V epitaxial material is covered by a layer of dicing dust shown in FIG. 14(e), proving no any sort of surface protection is employed during the dicing test.

Another thermal cycling step of baking bonded pairs to 250° C. in the air for 5-10 minutes after the InP substrate removal is routinely pursued to further verify the bonding strength since any voids with trapped gas byproducts at bonding interface become more visible then. On the other hand, remaining gases in VOC cavities would be able to cause delamination in this bake step if the bonding strength was not sufficiently strong to hold the III-V epitaxial layer and SOI together. No noticeable deformation or delamination of transferred III-V layers at or around VOCs is found, indicating high surface energy in the entire contacted area and possible decrease of gas pressure inside VOC cavities by either absorption or diffusion. Void densities of S=50 µm and 100 µm cases remain the same after an additional bake (data not shown), showing the completed outgassing process and excellent reliability of the bonding process. The same test is performed on the sample bonded over 2 months earlier, and no change in term of void density and III-V deformation is noticed (data not shown), which indicates that $H_2O$ absorption in the BOX layer (Eq. (5)) is not reversible as well.

Figure 10:
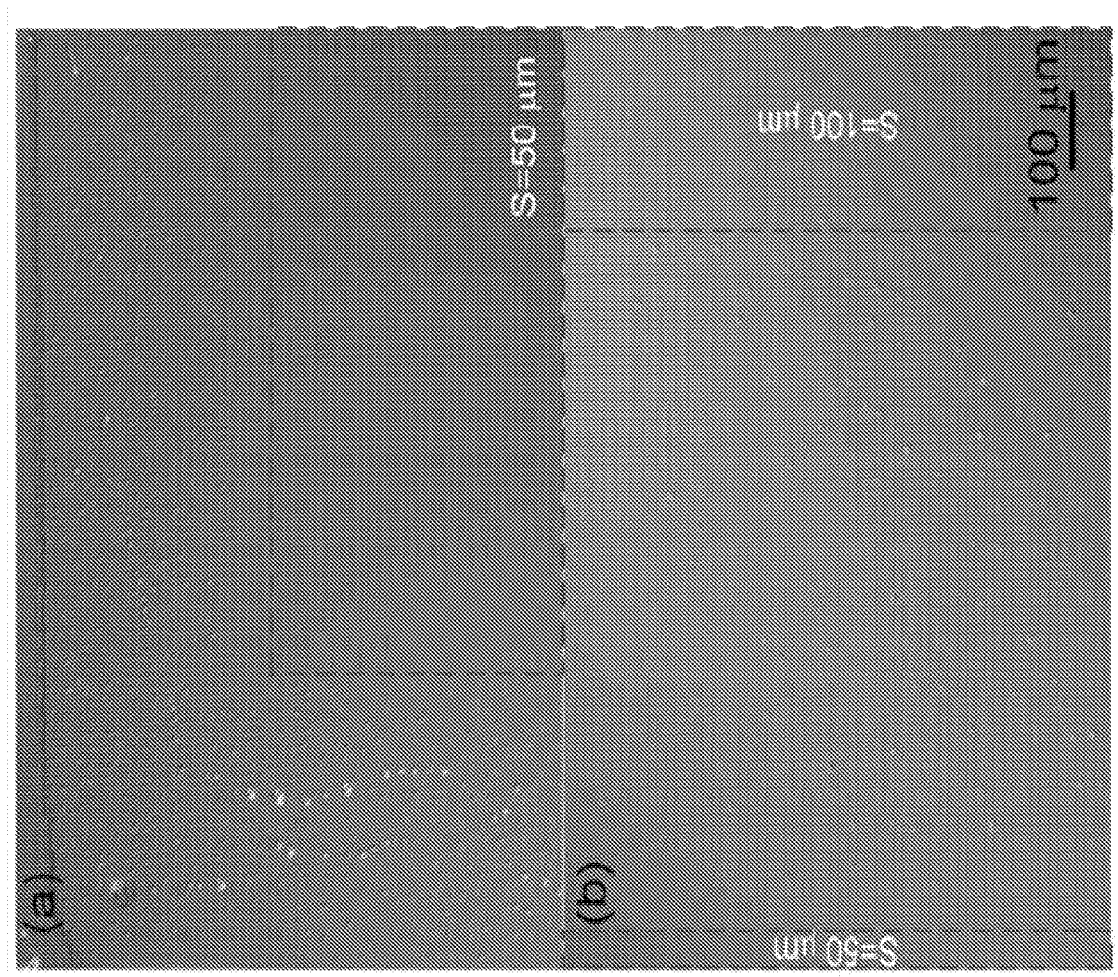
Figure 15:
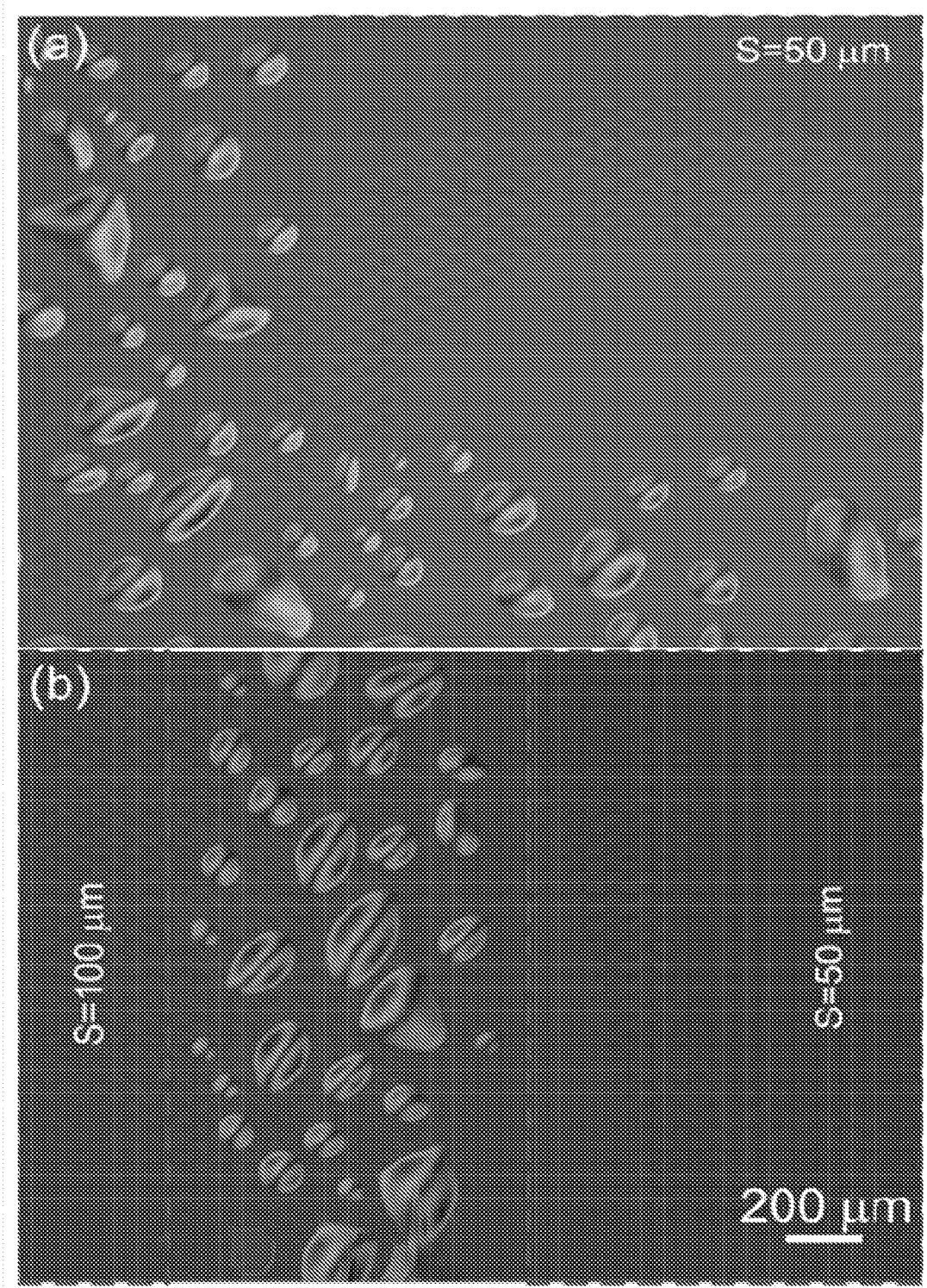
FIG. 15 illustrates Nomaski-mode microscopic images of a InP-SOI bonded pair using another InP epitaxial wafer with relatively poorer bondability than that in FIG. (3). After 300° C. anneal for 30 minutes, similar contrast in term of void formation is visible at VOC and non-VOC regions.

It is also interesting to note here that interfacial void formation characteristic is closely associated with surface states of materials, including surface roughness, surface epitaxial defects and hydroxyl group density after $O_2$ plasma treatment, etc. FIGS. 15(a) and (b) reveal the similar areas of bonded pair with III-V material from a different vendor after 300° C. anneal for 30 minutes as shown in FIG. 10. Unlike the high density of small size voids (<20 µm in diameter) in FIG. 10(a), voids in non-VOC areas display arbitrary shapes with even more than 200 µm in one direction in FIG. 15, primarily due to a larger number of surface defects in this epitaxial wafer which are preferable nucleation sites for gas aggregation[11] and slightly rougher surface which is helpful for gas byproduct migrating relatively long distance to gather at nucleation sites. Bonding on 1 cm² sample without VOCs or IPOCs fails (data not shown) because the InP epitaxial layers are totally peeled off during post-anneal substrate removal in HCl solution, indicating a intrinsically poorer bondability of this type of wafer and serious outgassing problem. Nevertheless, high-quality, void-free bonding is still attainable with the help of VOCs as shown in FIG. 15 where regions of S=100 µm and 50 µm (t=9 µm) are highlighted with red boxes. It demonstrates the robustness and universality of this process which can potentially lowers the criteria for bonding wafer selection, greatly reducing the overall manufacture cost. It should also be noted that although the VOC model discussed above describes the general outgassing principle with the help of a "gutter" layer, such as the BOX layer in this work, the values of interfacial void density observed in our experiments represent only those particular sets of wafers tested in particular conditions. More detailed studies on interfacial void formation characteristic associated with SOI and III-V material properties, surface chemistry and bonding process is under way.

Figure 16:
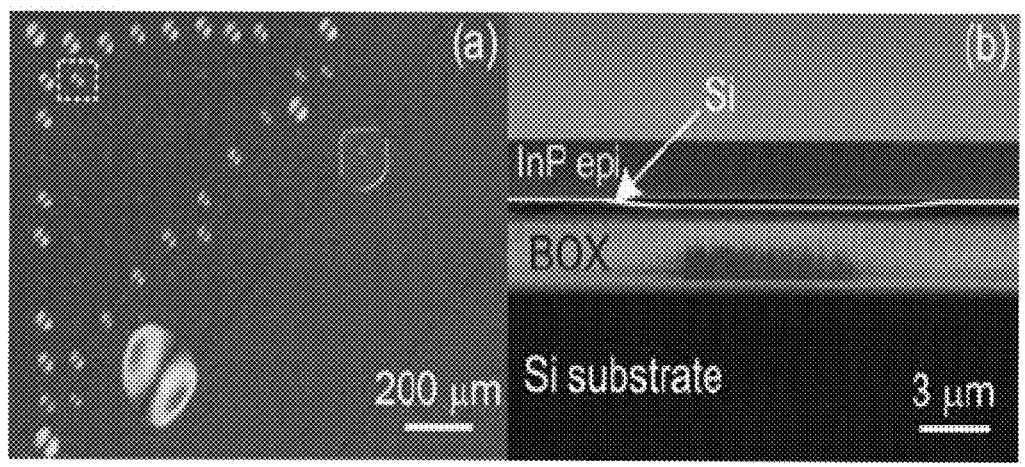
FIG. 16 illustrates Nomaski-mode microscopic top-view image (a) of InP epitaxial layer transferred to the SOI substrate where some VOCs are not etched through Si device layer, shown in the SEM cross-sectional image (b) cleaved through the yellow-dash line box in (a).

Finally the outgassing mechanism proposed and demonstrated in this paper is further confirmed by accidentally not etching down to the BOX layer as shown in FIG. 16(b), a SEM cross-sectional image of a yellow dash-line highlighted region in FIG. 16(a). Due to the photoresist build-up at the edge of the sample, some VOC pattern is not transferred to the $SiO_2$ hardmask perfectly, resulting in Si device is not completely etched through in some VOCs. Aggregated gas and trapped gas in VOCs cause the noticeable deformation of InP thin epitaxial layers, shown by those bouffant bubbles in some VOCs sites in FIG. 16(a). Cleaving through the bubble in FIG. 16(b) releases trapped gases and subsequently the internal pressure, but poor bonding surface energy can be qualitatively judged by perfect InP breakage along its (100) crystalline orientation. Unlike the strong bonding showed in a similar cross-sectional view in FIG. 8(d), poor bonding in FIG. 16(b) results in the Si and InP broken independently upon cleave, showing nice (100) facet on InP and rough facet on Si device layer.

Bonding Scalability

Figure 12:
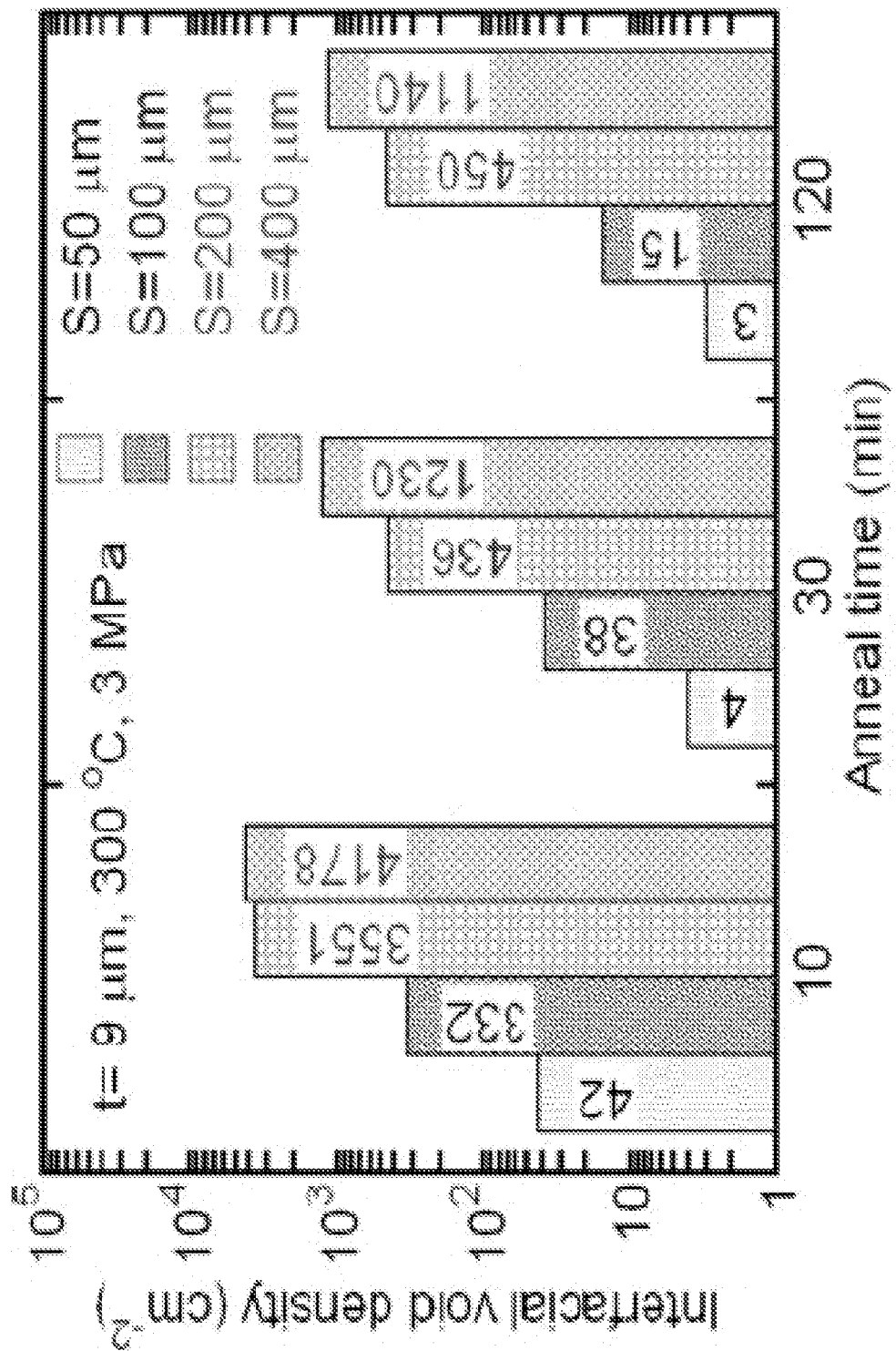
FIG. 12 illustrates interfacial void density as a function of anneal time periods of 10, 20 and 120 minutes for VOC spacing of S=400, 200, 100 and 50 μm, and fixed size of t=9 μm for bonded pairs annealed at 300° C. with 3 MPa external pressure.
Figure 17:
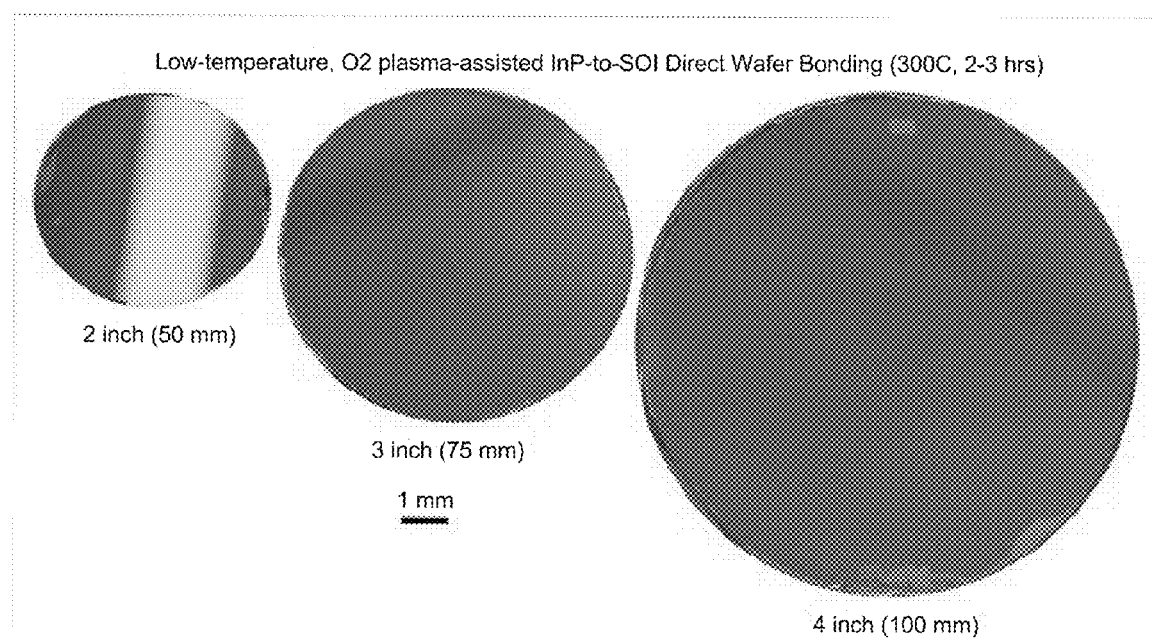
FIG. 17 illustrates 50 mm (2 inch), 75 mm (3 inch) and 100 mm (4 inch)InP epitaxial layers directly bonded to the SOI substrate with VOC of t=7 μm and S=100 μm after 300° C. anneal for 2-3 hours, showing mirror-like epitaxial transfer which leads to some reflection, i.e., a bright bar for 50 mm one and dark bars for 75 and 100 mm ones.

According to the FIGS. 11-13, each VOC appears capable of accommodating limited gas byproducts from neighboring region in a certain time period, resulting in an effective area coverage as a VOC at the center. Ideal, void-free bonding can be achieved as long as area coverage starts overlapping each other, eliminating the existence of the "dead zone", which is most likely to be the case of S=50 µm in this work. In another word, outgassing issue can be fundamentally eliminated if VOCs with appropriate scheme is employed, regardless of the wafer dimension. FIG. 17 demonstrates the successful transfer of 50 mm (2 inch), 75 mm (3 inch) and 100 mm (4 inch) in diameter InP-based epitaxial layer onto the SOI substrate with VOCs of S=100 µm and t=7 µm. The bonded wafers are annealed at 300° C. for 2-3 hours with 3 MPa pressure, showing the same bonding quality as 1 cm² samples. To our best knowledge, 4 inch bonding here is the record large InP-to-Si direct wafer bonding, i.e. no interfacial oxide or polymer adhesion layer. The success to applying the same bonding process to variable size of wafer bonding demonstrates promising process scalability with VOCs provided that wafers are clean, flat and smooth.

Additional Advantages

It is finally noted that the design of some embodiments of VOCs can embrace several more merits and processing convenience in addition to those discussed before.

In contrast to previously used IPOCs where gas and liquid can flow back in, bonding with VOCs isolates the bonding interface from the outside environment substantially completely in some embodiments, improving the bonding stability. Furthermore, the negative impact of local III-V breakage or peel-off due to interface particles, surface scratches or defects is small (data not shown) since the rest of bonded area is not subject to damage by hazardous gas or liquid.

A flexible device pattern design is available owing to the compatibility of the vertical outgassing process with conventional in-plane circuits and component layout.

Small footprint on SOI substrate even for VOCs with small spacing and relatively large dimension (i.e., S=50 µm and t=9 µm in this work) is resulted in some embodiments. Table 1 lists the percentage of unbonded area due to the absence of etched Si material. The maximum of 3.24% area consumption leaves plenty of room for high-density device integration, and optical, electrical and thermal interaction between SOI and III-V layers.

Preliminary X-ray diffraction study (data not shown) indicates that VOCs may even serve as "stress-relieving" pattern,[27] contributive to void suppression, allowing the thermally mismatched films to withstand postbonding device processing, and minimizing stress-induced defects. Further investigation is required to understand the underlying physics.

There are multiple ways to pattern and form VOCs which can be in various shapes of square, circle, rectangle, etc. or their combinations. The thermal anneal with VOCs doesn't require vacuum or forming gas either. No difference is noticeable for using SOI wafers with 1 μm and 3 μm BOX layer. They all result in desirable fabrication flexibility and low-cost process.

Process Chart

Figure 18:
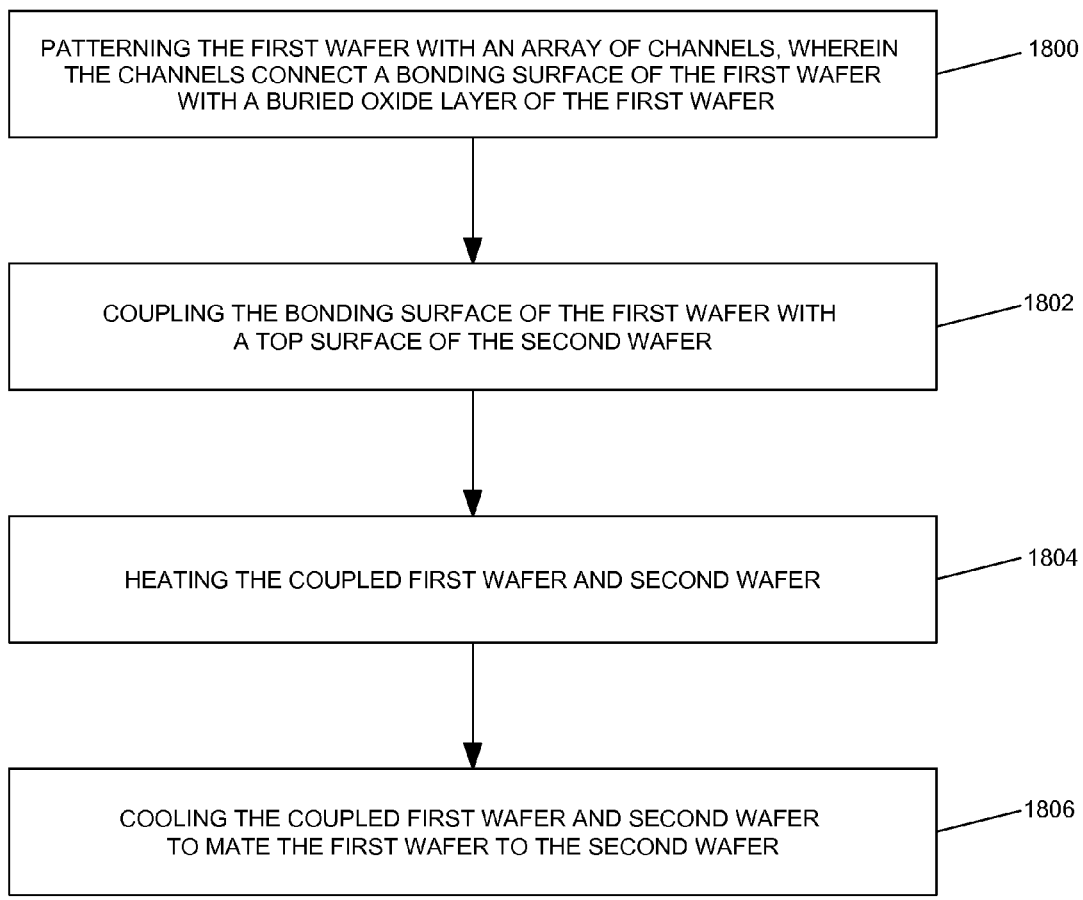
FIG. 18 illustrates a process chart in accordance with one or more embodiments of the present invention.

FIG. 18 illustrates a process chart in accordance with one or more embodiments of the present invention.

Box 1800 illustrates patterning the first wafer with an array of channels, wherein the channels connect a bonding surface of the first wafer with a buried oxide layer of the first wafer.

Box 1802 illustrates coupling the bonding surface of the first wafer with a top surface of the second wafer.

Box 1804 illustrates heating the coupled first wafer and second wafer.

Box 1806 illustrates and cooling the coupled first wafer and second wafer to mate the first wafer to the second wafer.

CONCLUSION

A simple, novel vertical outgassing channel (VOC) concept is introduced and the underlying chemistry is discussed in detail. The primary gas byproducts of $H_2O$ and $H_2$ from bonding polymerization reactions at low temperature are absorbed by the thick BOX layer in SOI substrate through VOCs. Dramatic interfacial void density reduction up to five orders of magnitude (from >50000 $cm^{-2}$ to $\leq 3$ $cm^{-2}$) is demonstrated on properly selected VOC scheme when only thin InP epitaxial layers are left on the SOI substrate, showing extremely efficient outgassing capability. The required minimum anneal time period at 300° C. is between 10-30 minutes for optimal bonding quality, a time period for the entire outgassing process to complete as well. It represents 36-108× time reduction compared to the previous in-plane outgassing channel (IPOC) design, and is an even larger reduction for the case of no outgassing channel. 3 MPa external pressure is experimentally found necessary to overcome the expansion of trapped air in VOC cavities. Bonding strength is characterized by crack-opening method and a harsh dicing test, both showing high surface energy. An additional thermal bake step also exhibits the stability and reliability of bonding with VOCs. The robustness and universality of this VOC design is confirmed by the same demonstrated outgassing efficiency when the identical process is applied to two different InP epitaxial wafers with good and poor bondability. A successful epitaxial transfer of a 75 mm InP wafer to SOI substrate unfolds the promising perspective to further scale it up to larger size for mass production, indicating that VOC design is wafer scale-independent and representing an approach to fundamentally resolve the outgassing issue in semiconductor-on-insulator-based direct wafer bonding. Several incidental advantages in device design and fabrication, bonding reliability, and bonding stress minimization are mentioned as well. The same outgassing principle can thus be applied to other low-temperature homogeneous or dissimilar material integration with a gutter layer involved. Further, other substrate materials besides silicon and InP, such as other III-V or 1'-VI materials, germanium, or other materials, can be used as either or both substrates within the scope of the present invention.

Described herein are wafer bonded devices with channels to improve the bonding of the devices. A wafer bonded device in accordance with one or more embodiments of the present invention comprises a substrate wafer having a buried oxide layer and a bonding layer, the bonding layer having at least one outgassing channel coupled between a bonding surface of the bonding layer and the buried oxide layer, and a second wafer, bonded to the bonding surface of the bonding layer.

Such a device further optionally comprises the at least one outgassing channel reducing interfacial void density between the substrate wafer and the second wafer, the at least one outgassing channel being a plurality of outgassing channels, the plurality of outgassing channels being arranged in an array, the plurality of outgassing channels having a consistent cross sectional shape, the consistent cross sectional shape being a substantially square cross sectional shape, an edge of the square cross sectional shape being between 2 and 10 microns, the array having a consistent spacing, the consistent spacing being selected as being a distance between 50 and 400 microns, the substrate wafer being a silicon wafer, and the second wafer being a III-V wafer.

A method for bonding a first wafer and a second wafer in accordance with one or more embodiments of the present invention comprises patterning the first wafer with an array of channels, wherein the channels connect a bonding surface of the first wafer with a buried oxide layer of the first wafer, coupling the bonding surface of the first wafer with a top surface of the second wafer, heating the coupled first wafer and second wafer, and cooling the coupled first wafer and second wafer to mate the first wafer to the second wafer.

Such a method further optionally comprises annealing the mated first and second wafers, and pressurizing the mated first and second wafers.

A heterojunction device in accordance with one or more embodiments of the present invention comprises a first substrate, comprising a device layer and a buried layer, wherein the device layer comprises at least one channel coupled between a top surface of the device layer and the buried layer, and a second substrate comprising an active layer, wherein the top surface of the device layer of the first substrate is wafer bonded to the active layer of the second substrate.

Such a device further optionally comprises the at least one channel reducing interfacial void density between the top surface of the device layer and the active layer of the second substrate, the at least one channel being a plurality of channels, the plurality of channels being arranged in an array, the array having a consistent spacing, and the consistent spacing being selected as being a distance between 50 and 400 microns.

REFERENCES

The following references are incorporated by reference herein:

[1] W. P. Maszara, J. Electrochem. Soc. 138, 341 (1991).

[2] W. George and I. P. Daniel, J. App. Phys. 40, 3946 (1969).

[3] Q.-Y. Tong, G. Fountain, and P. Enquist, App. Phys. Lett. 89, 042110 (2006).

[4] U. Gosele and Q. Y. Tong, Ann. Rev. of Mat. Sci. 28, 215 (1998).

[5] S. Mack, H. Baumann, U. Gosele, H. Werner and R. Schlogl, J. Electrochem. Soc. 144, 1106 (1997).

[6] S. Mack, H. Baumann, and U. Gösele, Sen. and Act. A: Phys. 56, 273 (1996).

[7] E. A. Irene, E. Tierney, and J. Angilello, J. Electrochem. Soc. 129, 2594 (1982).

[8] http://soitec.com/en/about/.

[9] Q.-Y. Tong and U. Gösele, *Semiconductor Wafer Bonding: Science and Technology*, $1^{st}$ ed. (John Wiley & Sons, New York, 1998), pp. 123.

[10] C. S. Tan, A. Fan, K. N. Chen and R. Reif, App. Phys. Lett. 82, 2649 (2003).

[11] X. X. Zhang and J. P. Raskin, IEEE J. Microelectromechanical Syst. 14, 368 (2005).

[12] H. Huang, X. Ren, W. Wang, H. Song, Q. Wang, S. Cai and Y. Huang, 90, 161102 (2007).
[13] Q.-Y. Tong, Q. Gan, G. Hudson, G. Fountain and P. Enquist, 84, 732 (2004).
[14] A. W. Fang, H. Park, Y.-H. Kuo, R. Jones, O. Cohen, D. Liang, O. Raday, M. N. Sysak, M. J. Paniccia and J. E. Bowers, Mat. Today 10, 28 (2007).
[15] H. Park, A. W. Fang, S. Kodama and J. E. Bowers, Opt. Exp. 13, 9460 (2005).
[16] A. W. Fang, H. Park, R. Jones, O. Cohen, M. J. Paniccia and J. E. Bowers, IEEE Photon. Tech. Lett. 18, 1143 (2006).
[17] M. Itsumi, $SiO_2$ in Si Microdevices, 1st ed. (Springer Verlag, Berlin, 2003), pp. 3.
[18] S. K. Ghandhi, VLSI Fabrication Principles: Silicon and Gallium Arsenide, 1st ed. (John Wiley and Sons, New York, 1983), pp. 376, 377.
[19] T. Bakos, S, N. Rashkeev, and S. T. Pantelides, Phys. Rev. Lett. 88, 055508-055501 (2002).
[20] A. G. Revesz, J. Electrochem. Soc. 126, 122 (1979).
[21] Q.-Y. Tong, G. Fountain, and P. Enquist, App. Phys. Lett. 89, 042110 (2006).
[22] D. Pasquariello and K. Hjort, IEEE J. Sel. Top. Quant. Electron. 8, 118 (2002).
[23] Y. L. Chao, Q.-Y. Tong, T. H. Lee, M. Reiche, R. Scholz, J. C. S. Woo and U. Gösele, Electrochem. Sol. Stat. Lett. 8, G74 (2005).
[24] D. Liang, A. W. Fang, H. Park, T. E. Reynolds, K. Warner, D. C. Oakley and J. E. Bowers, submitted to J. Electron. Mat. (2007).
[25] G. Kissinger and W. Kissinger, Sen. and Act. A: Phys. 36, 149 (1993).
[26] W. P. Maszara, G. Goetz, A. Caviglia and J. B. McKitterick, J. App. Phys. 64, 4943 (1988).
[27] E. D. Kim, N. K. Kim, S. C. Kim, I. V. Grekhov, T. V. Argunova, L. S. Kostina and T. V. Kudryavtseva, Electron. Lett. 31, 2047 (1995).

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but by the claims which form a part of this application, and the full range of equivalents of the claims.

What is claimed is:

1. A wafer bonded device, comprising:
a substrate wafer having a buried oxide layer and a bonding layer, the bonding layer having at least one outgassing channel coupled between a bonding surface of the bonding layer and the buried oxide layer; and
a second wafer, bonded to the bonding surface of the bonding layer, wherein gas byproducts traverse the at least one outgassing channel and diffuse into the buried oxide layer.

2. The wafer bonded device of claim 1, wherein the at least one outgassing channel reduces interfacial void density between the substrate wafer and the second wafer.

3. The wafer bonded device of claim 2, wherein the at least one outgassing channel is a plurality of outgassing channels.

4. The wafer bonded device of claim 3, wherein the plurality of outgassing channels are arranged in an array.

5. The wafer bonded device of claim 4, wherein the plurality of outgassing channels have a consistent cross sectional shape.

6. The wafer bonded device of claim 5, wherein the consistent cross sectional shape is a substantially square cross sectional shape.

7. The wafer bonded device of claim 6, wherein an edge of the square cross sectional shape is between 2 and 10 microns.

8. The wafer bonded device of claim 4, wherein the plurality of outgassing channels in the array have a consistent spacing.

9. The wafer bonded device of claim 8, wherein the consistent spacing is selected as being a distance between 50 and 400 microns.

10. The wafer bonded device of claim 1, wherein the substrate wafer is a silicon wafer.

11. The wafer bonded device of claim 1, wherein the second wafer is a III-V wafer.

* * * * *